US012740174B2

(12) United States Patent
Kim et al.

(10) Patent No.: US 12,740,174 B2
(45) Date of Patent: Sep. 15, 2026

(54) IMAGE SENSOR AND METHOD OF FABRICATING THE SAME

(71) Applicant: Samsung Electronics Co., Ltd., Suwon-si (KR)

(72) Inventors: Kook Tae Kim, Suwon-si (KR); Jingyun Kim, Suwon-si (KR); Byeongtaek Bae, Suwon-si (KR); Seunghwi Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 418 days.

(21) Appl. No.: 18/446,752

(22) Filed: Aug. 9, 2023

(65) Prior Publication Data

US 2024/0145513 A1 May 2, 2024

(30) Foreign Application Priority Data

Nov. 2, 2022 (KR) ........................ 10-2022-0144758

(51) Int. Cl.
*H10F 39/00* (2025.01)

(52) U.S. Cl.
CPC ......... *H10F 39/807* (2025.01); *H10F 39/802* (2025.01); *H10F 39/811* (2025.01)

(58) Field of Classification Search
CPC .... H10F 39/807; H10F 39/802; H10F 39/811; H10F 39/014; H10F 39/18; H10F 39/199; H10F 39/8053; H10F 39/8063; H10F 39/8023; H10F 39/182; H10F 39/011; H10F 39/803
See application file for complete search history.

(56) References Cited

U.S. PATENT DOCUMENTS 11,233,080 B2 1/2022 Liu et al.
11,264,421 B2 3/2022 Ge
11,362,121 B2 6/2022 Zang et al.
2021/0143191 A1 5/2021 Ha et al.
2021/0193706 A1* 6/2021 Kim .................... H10F 39/8053
2022/0037381 A1 2/2022 Xia et al.
2022/0077204 A1 3/2022 Lee et al.
2022/0102397 A1 3/2022 Wu et al.
2022/0115421 A1 4/2022 Huang et al.
2022/0130888 A1 4/2022 Chou et al.

FOREIGN PATENT DOCUMENTS

KR 20210081217 A 7/2021
KR 20220031807 A 3/2022

* cited by examiner

*Primary Examiner* — Tucker J Wright
(74) *Attorney, Agent, or Firm* — Harness, Dickey & Pierce, P.L.C.

(57) ABSTRACT

An image sensor includes a substrate including a first surface and a second surface opposite to the first surface, and a pixel separation part in the substrate, the pixel separation part separating a plurality of pixels from each other, the plurality of pixels including first to fourth pixels in a clockwise direction, the pixel separation part including a first part between the first and second pixels, and a second part between the first pixel and the third pixel. Each of the first part and the second part includes a first dielectric pattern covering a lateral surface of the substrate, and a first silicon pattern covering a lateral surface of the first dielectric pattern. The second part further includes a second silicon pattern adjacent to a sidewall of the first silicon pattern. The second silicon pattern has a rhombic shape in a plan view.

20 Claims, 31 Drawing Sheets

12a
7
5
15
13
22(2)
1
C'
H2
C
B'
1a
15r2
14
1b
9
22(3)
H3
B
A'
H1
15r1
22(1)
A

IL
STI
16
15r1
14
13
12
DTI(P1)
22(1)
1
A
A'
B
B'
C
C'
TG
Gox
FD
17
1a
1b
22(3)
PD
15r2
DTI(P3)
16
15
13
12
DTI(P2)
22(2)

503
DTI
14
13
12
15
15r1
15r2
PX(3)
PX(2)
PX(1)
PX(4)
B'
B
A'
A
C'
C
P1
P2
P3
W1
W2
W3
FD
ACT
TG
1
X
Y
Z

503
ML
CF1
50a
48a
44
24
1
22(1)
12
13
14
15r1
16
STI
DTI(P1)
IL
W1
W3
W2
A
A'
B
B'
C
C'
CF2
1b
22(2)
DTI(P2)
22(3)
PD
DTI(P3)
15r2
TG
Gox
FD
1a
17

504
ML
CF1
50a
48a
44
24
1
22(1)
12
13
14
15r1
16
STI
DTI(P1)
IL
W1
A
A'
B
B'
C
C'
W3
22(3)
PD
CF2
TG
Gox
FD
STI
17
1a
DTI(P3)
15r2
W2
22(2)
1b
DTI(P2)
15

504
ML
CF1
CF2
50a
48a
44
24
1
1b
22(1)
22(2)
22(3)
12
13
14
15
16
15r1
15r2
VD
DTI(P1)
DTI(P2)
DTI(P3)
STI
IL
PD
TG
Gox
FD
1a
17
W1
W2
W3
A
A'
B
B'
C
C'

505
ML
CF1
CF2
50a
48a
44
24
1
1a
1b
24P
22(1)
22(2)
22(3)
12
13
14
15
15r1
15r2
16
VD
STI
DTI(P1)
DTI(P2)
DTI(P3)
PD
TG
Gox
FD
17
IL
W1
W2
W3
A
A'
B
B'
C
C'

FIG. 16

IMAGE SENSOR AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0144758 filed on Nov. 2, 2022 in the Korean Intellectual Property Office, the disclosure of which is hereby incorporated by reference in its entirety.

BACKGROUND

The present inventive concepts relate to an image sensor and a method of fabricating the same.

An image sensor is a semiconductor device that transforms optical images into electrical signals. The image sensor may be classified into a charge coupled device (CCD) type and/or a complementary metal oxide semiconductor (CMOS) type. The CIS (CMOS image sensor) is a short for the CMOS type image sensor. The CIS may include a plurality of two-dimensionally arranged pixels. Each, or one or more, of the pixels includes a photodiode (PD). The photodiode serves to transform an incident light into an electrical signal.

SUMMARY

Some example embodiments of the present inventive concepts provide an image sensor capable of achieving sharp images.

Some example embodiments of the present inventive concepts provide a method of fabricating the image sensor.

The object of the present inventive concepts are not limited to the mentioned above, and other objects which have not been mentioned above will be clearly understood to those skilled in the art from the following description.

According to some example embodiments of the present inventive concepts, an image sensor includes a substrate including a first surface and a second surface opposite to the first surface, and a pixel separation part in the substrate, the pixel separation part separating a plurality of pixels from each other, the plurality of pixels including first to fourth pixels in a clockwise direction, the pixel separation including, a first part between the first pixel and the second pixel, and a second part between the first pixel and the third pixel. Each of the first part and the second part includes, a first dielectric pattern covering a lateral surface of the substrate, and a first silicon pattern covering a lateral surface of the first dielectric pattern. The second part further includes a second silicon pattern adjacent to a sidewall of the first silicon pattern. The second silicon pattern has a rhombic shape in a plan view.

According to some example embodiments of the present inventive concepts, an image sensor may include a substrate including a first surface and a second surface opposite to the first surface, and a deep trench, and a pixel separation part in the deep trench, the pixel separation part separating a plurality of pixels from each other, the plurality of pixels including first to fourth pixels in a clockwise direction. The deep trench includes a first deep trench between the first pixel and the second pixel, and a second deep trench between the first pixel and the third pixel. The pixel separation part includes a first part in the first deep trench, and a second part in the second deep trench. Each of the first part and the second part includes a first dielectric pattern covering a lateral surface of the substrate, and a first silicon pattern covering a lateral surface of the first dielectric pattern. The first part further includes a first buried dielectric pattern in contact with a sidewall of the first silicon pattern. The second part further includes a second silicon pattern in contact with the sidewall of the first silicon pattern. The second silicon pattern may fill the second deep trench.

According to some example embodiments of the present inventive concepts, an image sensor includes a substrate including a first surface and a second surface opposite to the first surface, and a pixel separation part in the substrate, the pixel separation part separating a plurality of pixels from each other, the plurality of pixels including first to fourth pixels in a clockwise direction, the pixel separation part including, a first part between the first pixel and the second pixel, and a second part between the first pixel and the third pixel. Each of the first part and the second part includes a first dielectric pattern covering a lateral surface of the substrate, and a first silicon pattern covering a lateral surface of the first dielectric pattern. The second part further includes a second silicon pattern in contact with a sidewall of the first silicon pattern, and a void within the second silicon pattern.

According to some example embodiments of the present inventive concepts, a method of fabricating an image sensor includes forming a plurality of deep trenches in a substrate, the plurality of deep trenches separating a plurality of pixels from each other, the plurality of pixels including first to fourth pixels in a clockwise direction, and the forming the plurality of deep trenches including forming a first deep trench between the first and second pixels, the first deep trench having a first width, and forming a second deep trench between the first and third pixels, the second deep trench having a second width greater than the first width, forming a first isolation dielectric layer and a first silicon pattern on inner walls of the first and second deep trenches; forming a first buried dielectric pattern in the first deep trench; forming a second silicon pattern in the second deep trench; and forming a second buried dielectric pattern in the first and second deep trenches.

BRIEF DESCRIPTION OF THE DRAWINGS

FIG. 16 illustrates a cross-sectional view showing an image sensor according to some example embodiments of the present inventive concepts.

DETAIL PARTED DESCRIPTION OF EMBODIMENTS

Figure 1:
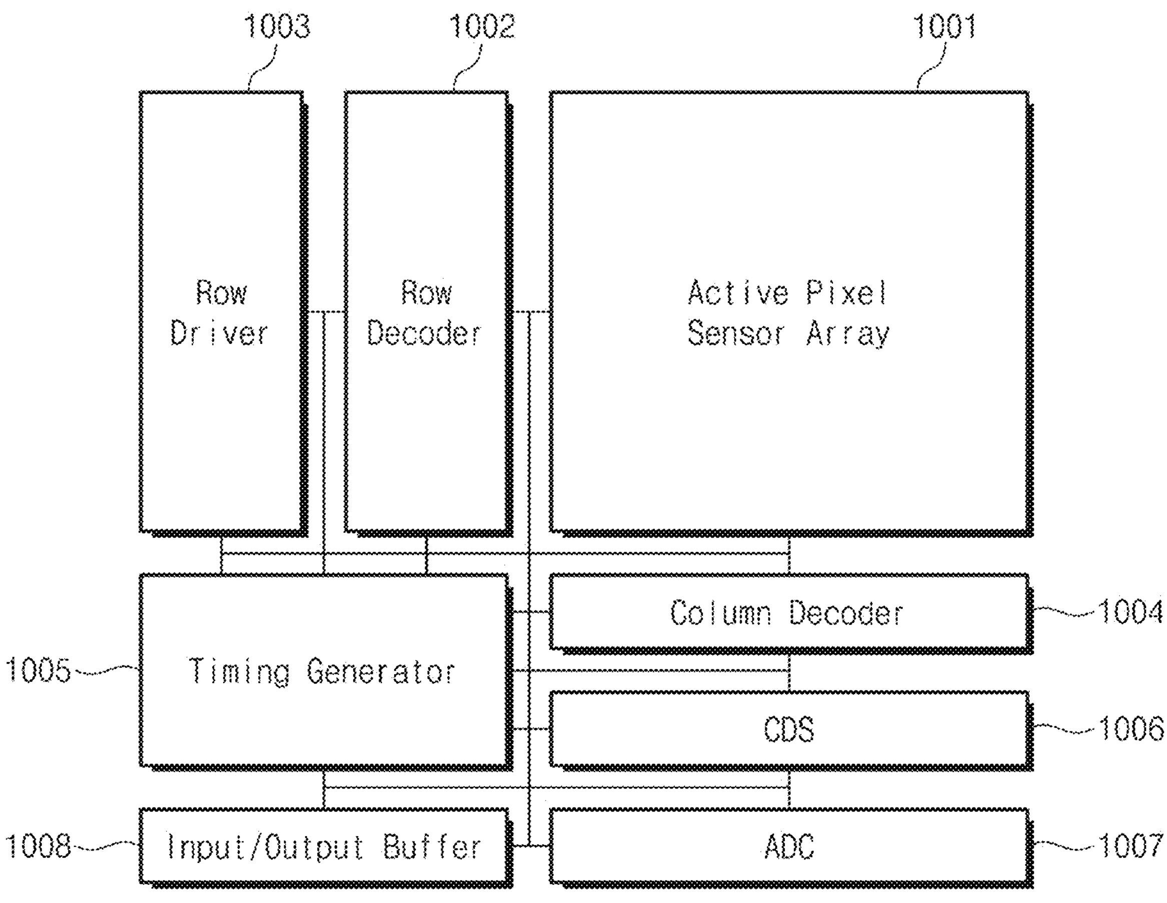
FIG. 1 illustrates a block diagram showing an image sensor according to some example embodiments of the present inventive concepts.

Some example embodiments of the present inventive concepts will now be described in detail with reference to the accompanying drawings to aid in clearly explaining the present inventive concepts.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. Further, regardless of whether numerical values or shapes are modified as "about" or "substantially," it will be understood that these values and shapes should be construed as including a manufacturing or operational tolerance (e.g., ±10%) around the stated numerical values or shape.

When an element is referred to as being "connected to" or "electrically connected to" another element, the element may be directly connected to the other element, or one or more other intervening elements may be present. For example, an element described as being "connected to" another element may be "electrically connected to" the other element. In contrast, when an element is referred to as being "directly connected to" another element there are no intervening elements present.

FIG. 1 illustrates a block diagram showing an image sensor according to some example embodiments of the present inventive concepts.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and/or an input/output (I/O) buffer 1008.

The active pixel sensor array 1001 may include a plurality of two-dimensionally arranged unit pixels, each, or one or more, of which is configured to convert optical signals into electrical signals. The active pixel sensor array 1001 may be driven by a plurality of driving signals such as a pixel selection signal, a reset signal, and/or a charge transfer signal from the row driver 1003. The correlated double sampler 1006 may be provided with the converted electrical signals.

The row driver 1003 may provide the active pixel sensor array 1001 with several driving signals for driving several unit pixels in accordance with a decoded result obtained from the row decoder 1002. When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated from the active pixel sensor array 1001, and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter 1007 may convert analog signals, which correspond to the difference level received from the correlated double sampler 1006, into digital signals, and then output the converted digital signals.

The input/output buffer 1008 may latch the digital signals and then sequentially output the latched digital signals to an image signal processing unit (not shown) in response to the decoded result obtained from the column decoder 1004.

Figure 2:
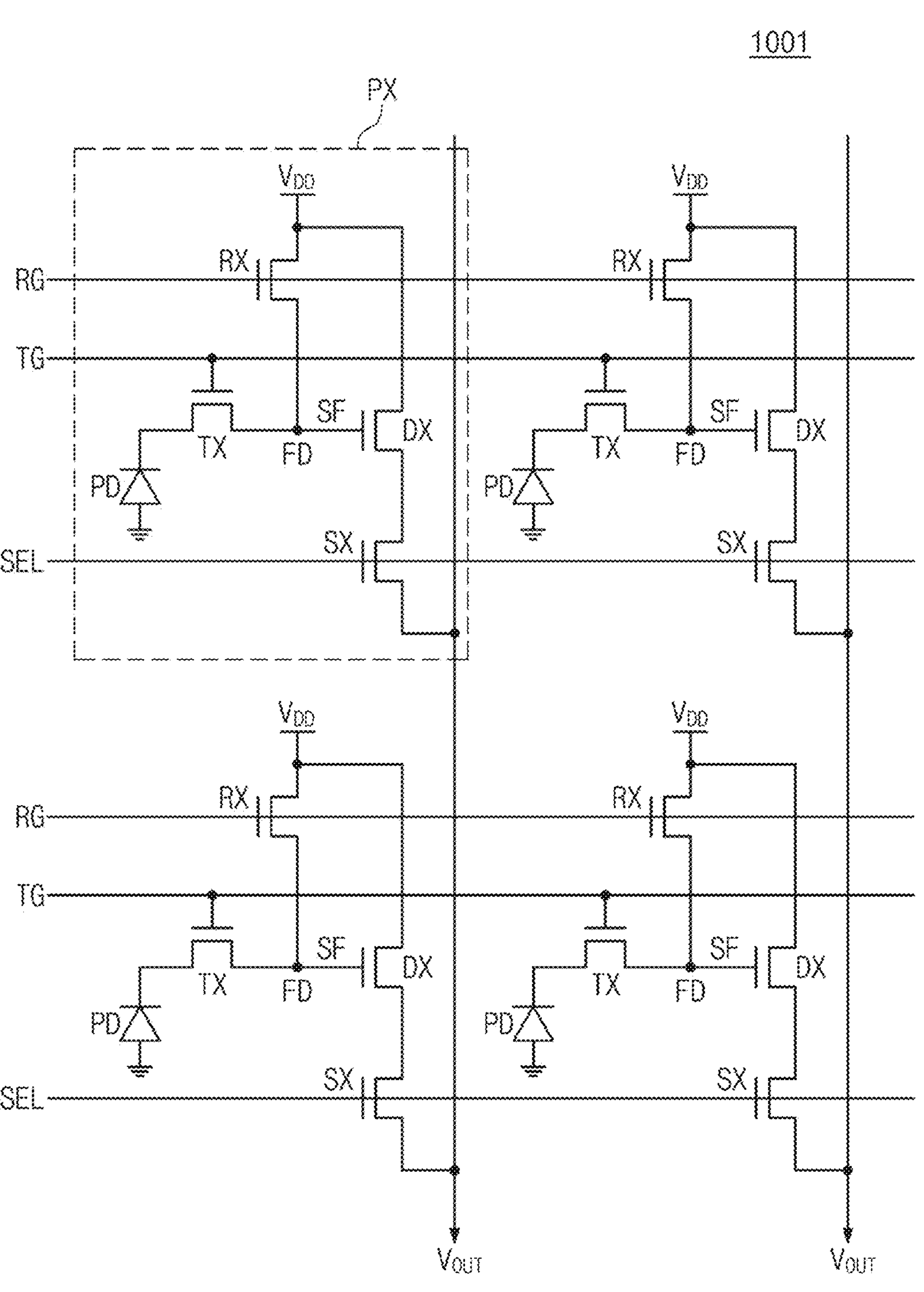
FIG. 2 illustrates a circuit diagram showing an active pixel sensor array of an image sensor according to some example embodiments of the present inventive concepts.

FIG. 2 illustrates a circuit diagram showing an active pixel sensor array of an image sensor according to some example embodiments of the present inventive concepts.

Referring to FIGS. 1 and 2, the active pixel sensor array 1001 may include a plurality of unit pixels PX, and the unit pixels PX may be arranged in a matrix shape. Each, or one or more, unit pixel PX may include a transfer transistor TX. Each, or one or more, unit pixel PX may further include logic transistors RX, SX, and/or DX. The logic transistors RX, SX, and/or DX may include a reset transistor RX, a selection transistor SX, and/or a source follower transistor DX. The transfer transistor TX may include a transfer gate TG. Each, or one or more, of the unit pixels PX may further include a photoelectric conversion element PD and/or a floating diffusion region FD. The logic transistors RX, SX, and/or DX may be shared by a plurality of unit pixels UP.

The photoelectric conversion element PD may create and accumulate photo-charges in proportion to an amount of externally incident light. The photoelectric conversion element PD may include a photodiode, phototransistor, a photogate, a pinned photodiode, and/or a combination thereof. The transfer transistor TX may transfer charges generated in the photoelectric conversion element PD into the floating diffusion region FD. The floating diffusion region FD may accumulate and store charges that are generated and transferred from the photoelectric conversion element PD. The source follower transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage VDD. When the reset transistor RX is turned on, the floating diffusion region FD may be supplied with the power voltage VDD connected to the source electrode of the reset transistor RX. Accordingly, when the reset transistor RX is turned on, the charges accumulated in the floating diffusion region FD may be exhausted and thus the floating diffusion region FD may be reset.

The source follower transistor DX including a source follower gate SF may serve as a source follower buffer amplifier. The source follower transistor DX may amplify a variation in electrical potential of the floating diffusion region PD and may output the amplified electrical potential to an output line VOUT.

The selection transistor SX including a selection gate SEL may select each, or one or more, row of the unit pixel P to be readout. When the selection transistor SX is turned on, the power voltage VDD may be applied to a drain electrode of the source follower transistor DX.

Figure 3A:
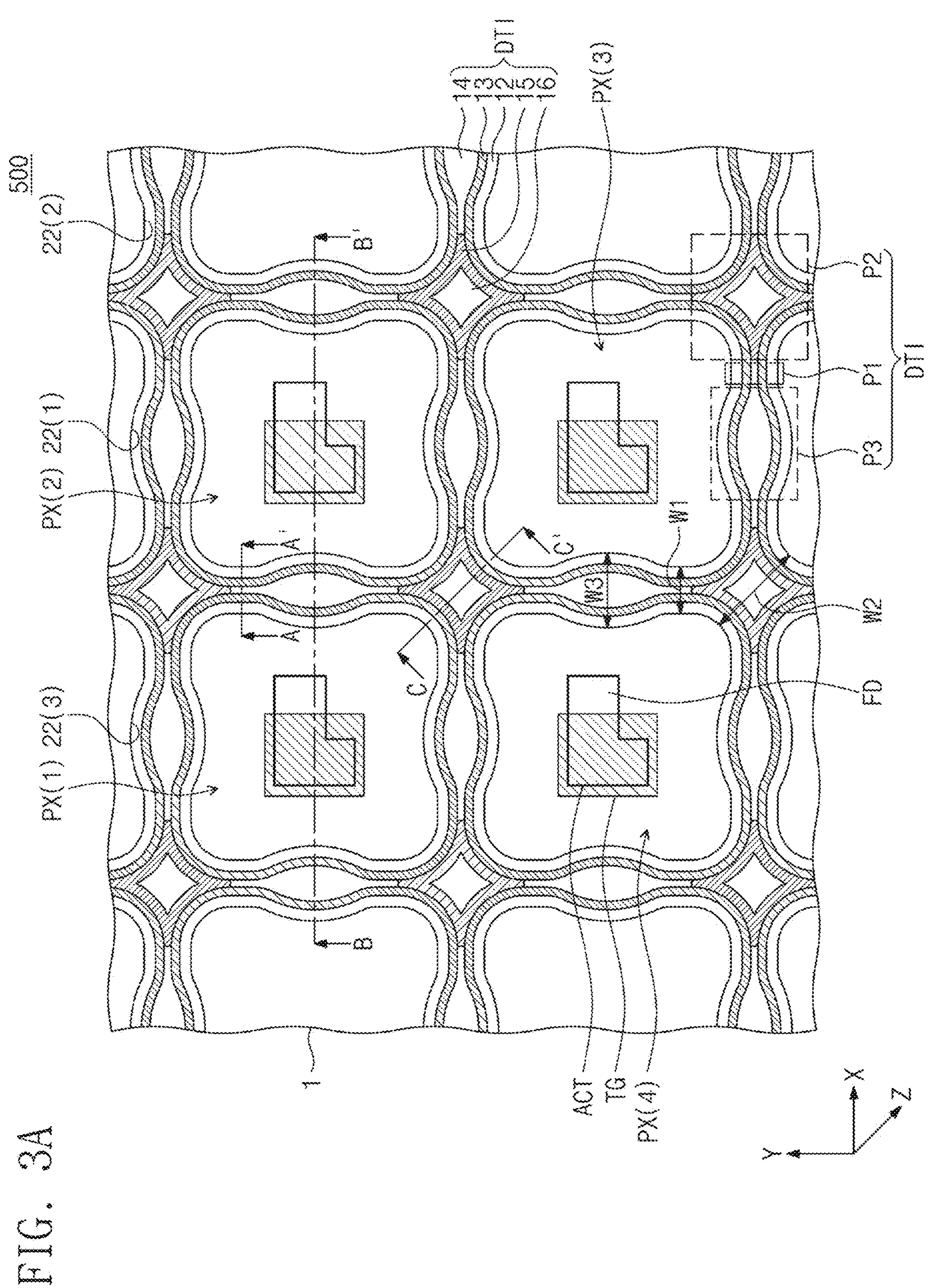
FIGS. 3A and 3B illustrate plan views showing an image sensor according to some example embodiments of the present inventive concepts.
Figure 3B:
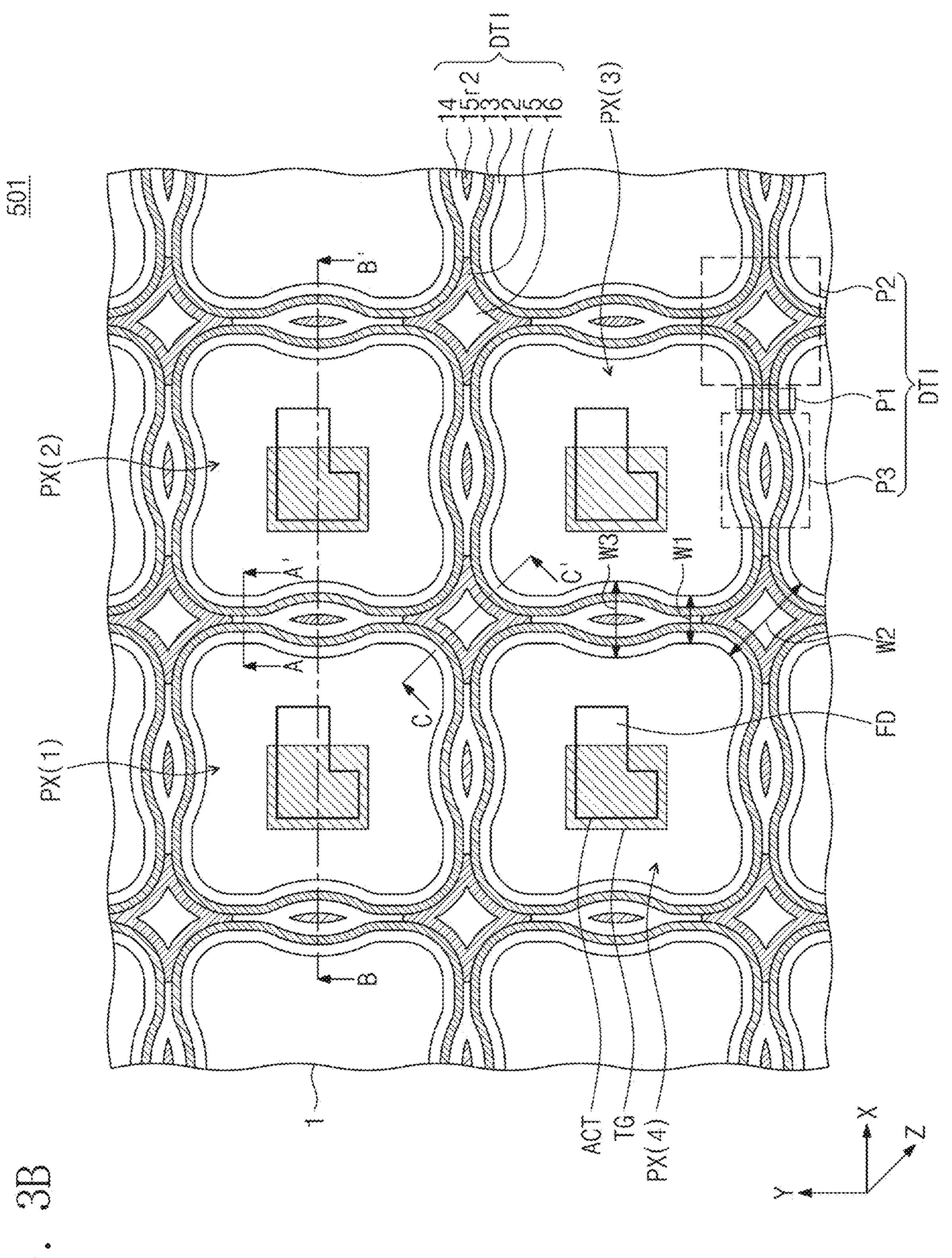
Figure 4:
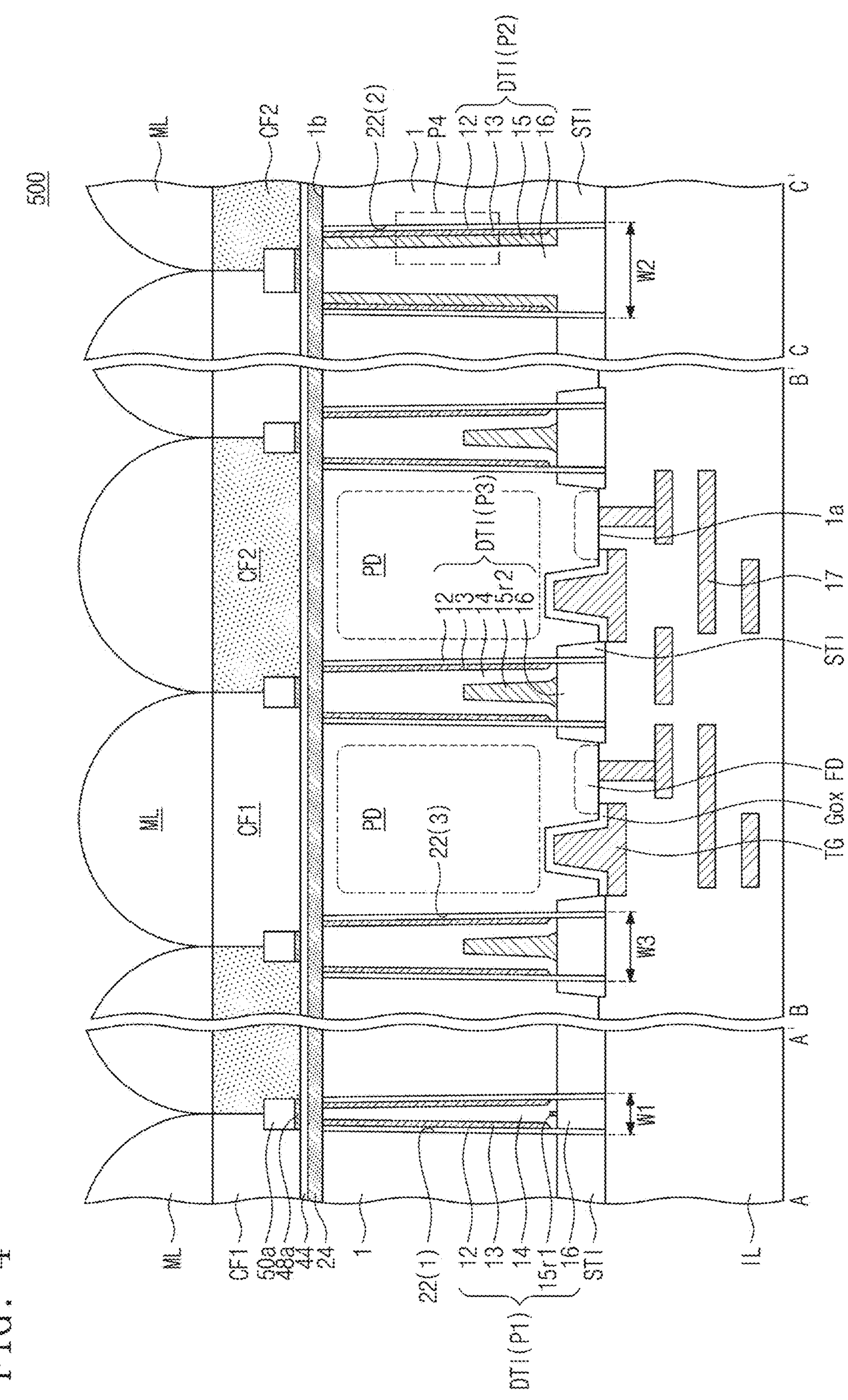
FIG. 4 illustrates a cross-sectional view taken along lines A-A', B-B', and C-C' of FIG. 3A or 3B, showing an image sensor according to some example embodiments of the present inventive concepts.

FIGS. 3A and 3B illustrate plan views showing an image sensor according to some example embodiments of the present inventive concepts. FIG. 4 illustrates a cross-sectional view taken along lines A-A', B-B', and C-C' of FIG. 3A or 3B, showing an image sensor according to some example embodiments of the present inventive concepts. FIGS. 5A to 5D illustrate enlarged views showing section P4 of FIG. 4 according to some example embodiments of the present inventive concepts.

Referring to FIGS. 3A and 4, an image sensor 500 according to some example embodiments of the present inventive concepts may include a first substrate 1. The first substrate 1 may be, for example, a monocrystalline silicon wafer, a silicon epitaxial layer substrate, and/or a silicon-on-insulator (SDI) substrate. The first substrate 1 may be doped with impurities having a first conductivity type. For example, the first conductivity type may be a p-type. The first substrate 1 may have a front surface 1*a* and a rear surface 1*b* that are opposite to each other. In this description, the front surface 1*a* may be called a first surface, and the rear surface 1*b* may be called a second surface. The first substrate 1 may include a plurality of unit pixels PX.

The unit pixels PX may include first to fourth pixels PX(1) to PX(4) arranged along a clockwise direction. The first and second pixels PX(1) and PX(2) may be arranged side by side along a first direction X. The fourth and first pixels PX(4) and PX(1) may be arranged side by side along a second direction Y that intersects the first direction X. The first and third pixels PX(1) and PX(3) may be arranged side by side along a third direction Z that intersects both the first direction X and the second direction Y.

The first substrate 1 may be provided therein with a pixel separation part DTI that separates and/or limits the unit pixels PX. The pixel separation part DTI may have a network shape when viewed in plan.

The pixel separation part DTI may include first to third separation parts P1 to P3. The first separation part P1 may be interposed between the first and second pixels PX(1) and PX(2), and may be adjacent to edges of the first and second pixels PX(1) and PX(2). The second separation part P2 may be interposed between the first and third pixels PX(1) and PX(3). The third separation part P3 may be interposed between centers of the first and second pixels PX(1) and PX(2). The first separation part P1 may have a first width W1 in the first direction X. The second separation part P2 may have a second width W2 in the third direction Z. The third separation part P3 may have a third width W3 in the first direction X. The third width W3 may be greater than the first width W1 and less than the second width W2. The pixel separation part DTI may have an uneven structure on a sidewall thereof.

The pixel separation part DTI may be positioned in a deep trench 22 that is formed from the front surface 1*a* toward the rear surface 1*b* of the first substrate 1. The deep trench 22 may include first to third deep trenches 22(1) to 22(3). The first separation part P1 may be disposed in the first deep trench 22(1). The second separation part P2 may be disposed in the second deep trench 22(2). The third separation part P3 may be disposed in the third deep trench 22(3).

Referring to FIGS. 3A, 4, and 5, each, or one or more, of the first to third separation parts P1 to P3 may include a first isolation dielectric pattern 12 that covers an inner sidewall of the deep trench 22, and may also include a first silicon pattern 13 that covers a sidewall of the first isolation dielectric pattern 12. When viewed in plan, the first isolation dielectric pattern 12 and the first silicon pattern 13 may each surround the unit pixel PX.

The first and/or third separation parts P1 and/or P3 may further include a second buried dielectric pattern 16 and/or a first buried dielectric pattern 14 that covers a sidewall of the first silicon pattern 13. On the first and/or third separation parts P1 and/or P3, the first buried dielectric pattern 14 may cover a bottom end of the first silicon pattern 13. The second buried dielectric pattern 16 may be positioned below the first buried dielectric pattern 14. Each, or one or more, of the first and/or second buried dielectric patterns 14 and/or 16 may be formed of a dielectric material whose refractive index is different from that of first substrate 1. The first and/or second buried dielectric patterns 14 and/or 16 may independently have a single-layered and/or multi-layered structure of at least one selected from silicon oxide, silicon nitride, and/or silicon oxynitride.

The first separation part P1 may further include a first residual silicon pattern 15*r*1. On the first separation part P1, the first residual silicon pattern 15*r*1 may be disposed in a central lower portion of the first buried dielectric pattern 14, and may be interposed between the first buried dielectric pattern 14 and the second buried dielectric pattern 16.

The third separation part P3 may further include a second residual silicon pattern 15*r*2. On the third separation part P3, the second residual silicon pattern 15*r*2 may be disposed in a central lower portion of the first buried dielectric pattern 14, and may be interposed between the first buried dielectric pattern 14 and the second buried dielectric pattern 16. The first residual silicon pattern 15*r*1 may have its width and height less than those of the second residual silicon pattern 15*r*2. When viewed in plan, the second residual silicon pattern 15*r*2 may have an oval shape the same as or similar to that of an image sensor 501 depicted in FIG. 3B. Although not shown in either FIG. 3A or FIG. 3B, the first residual silicon pattern 15*r*1 may connect the second silicon pattern 15 to the second residual silicon pattern 15*r*2. Alternatively, one or both of the first and/or second residual silicon patterns 15*r*1 and/or 15*r*2 may be spaced apart from the second silicon pattern 15.

The first residual silicon pattern 15*r*1 and the second residual silicon pattern 15*r*2 may be doped with first impurities (e.g., boron). In this case, a concentration of the first impurities (e.g., boron) may be the same as or less than a concentration of first impurities (e.g., boron) doped in the first silicon pattern 13.

The second separation part P2 may further include a second silicon pattern 15 that covers a sidewall of the first silicon pattern 13 and a second buried dielectric pattern 16 that covers a sidewall of the first silicon pattern 13. The second silicon pattern 15 may cover a bottom end of the first silicon pattern 13. The second buried dielectric pattern 16 may cover a bottom end of the second silicon pattern 15. The second silicon pattern 15 may have a hollow rhombic shape when viewed in plan.

Figure 5A:
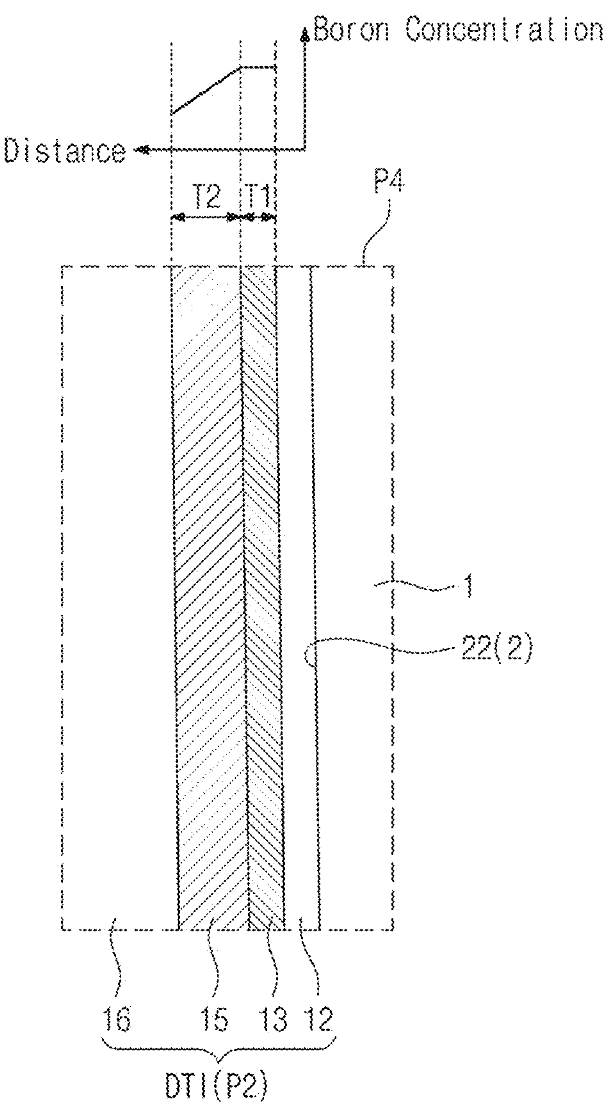
FIGS. 5A to 5D illustrate enlarged views showing section P4 of FIG. 4 according to some example embodiments of the present inventive concepts.

Referring to FIG. 5A, the first silicon pattern 13 may have a first thickness T1. The second silicon pattern 15 may have a second thickness T2 greater than the first thickness T1. The first silicon pattern 13 and/or the second silicon pattern 15 may be doped with first impurities (e.g., boron). A concentration of the first impurities (e.g., boron) in the first silicon pattern 13 may be the same as or greater than a concentration of the first impurities (e.g., boron) in the second silicon pattern 15. The concentration of the first impurities (e.g., boron) in the second silicon pattern 15 may decrease with decreasing distance from the second buried dielectric pattern 16. Alternatively, the concentration of the first impurities (e.g., boron) in the second silicon pattern 15 may be constant irrespective of position, and may be the same as the concentration of the first impurities (e.g., boron) in the first silicon pattern 13.

The first silicon pattern 13 and the second silicon pattern 15 may be in contact with each other. The second silicon pattern 15 may connect to each other the first silicon patterns 13 each, or one or more, of which surrounds the unit pixel PX.

A negative bias voltage may be applied to the first silicon pattern 13 and/or the second silicon pattern 15. The first silicon pattern 13 and/or the second silicon pattern 15 may serve as a common bias line. Therefore, holes possibly present on a surface of the first substrate 1 in contact with the pixel separation parts DTI may be trapped to improve dark current properties.

Figure 5B:
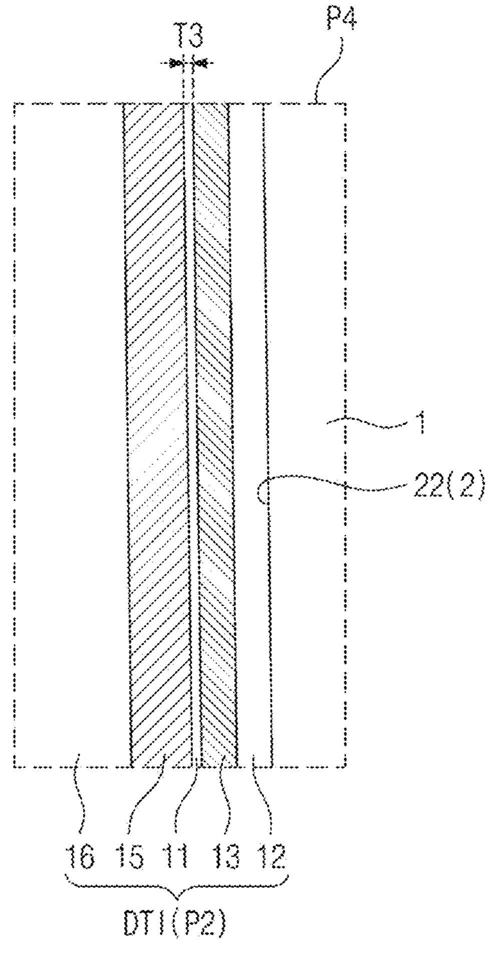

Alternatively, referring to FIG. 5B, a native oxide layer 11 may be disposed between the first silicon pattern 13 and the second silicon pattern 15. The native oxide layer 11 may have a third thickness T3. The third thickness T3 may range, for example, from about 1 Å to about 5 Å. As the third thickness T3 is thin equal to or less than about 5 Å, the first silicon pattern 13 and the second silicon pattern 15 may be electrically connected to each other.

Figure 5C:
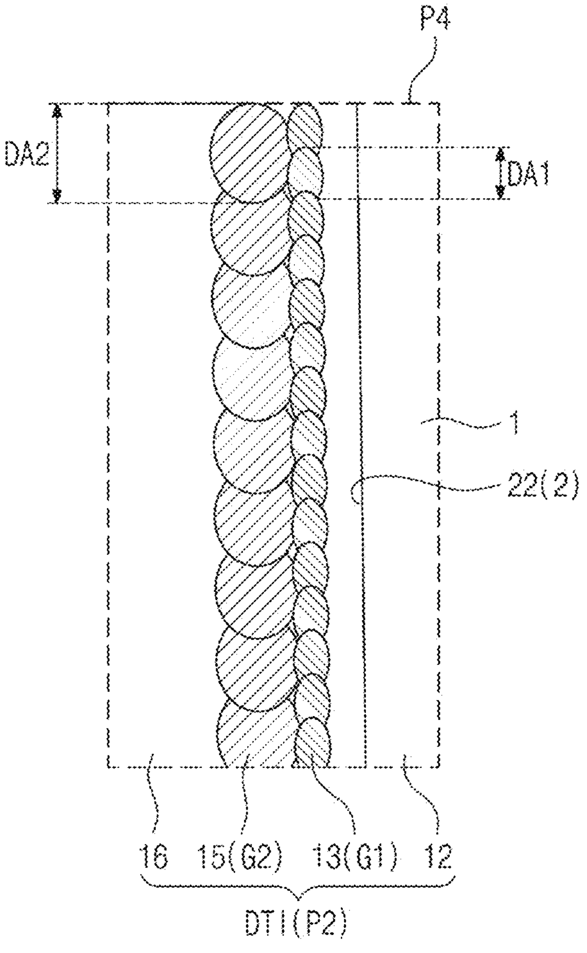

Alternatively, referring to FIG. 5C, the first silicon pattern 13 may include first silicon grains G1 each, or one or more, having a first average diameter DA1. The second silicon pattern 15 may include second silicon grains G2 each, or one or more, having a second average diameter DA2. The second average diameter DA2 may be greater than the first average diameter DA1. A density of the first silicon grains G1 in the first silicon pattern 13 may be greater than a density of the second silicon grains G2 in the second silicon pattern 15.

Figure 5D:
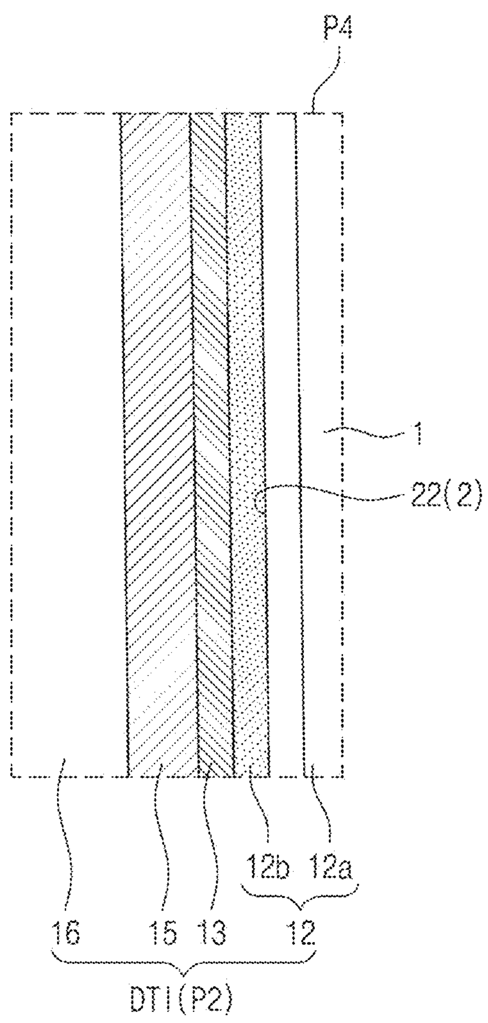

Alternatively, referring to FIG. 5D, the first isolation dielectric pattern 12 may include a first sub-isolation dielectric pattern 12*a* and/or a second sub-isolation dielectric pattern 12*b*. The first sub-isolation dielectric pattern 12*a* and the second sub-isolation dielectric pattern 12*b* may include dielectric materials whose dielectric constants are different from each other. For example, the first sub-isolation dielectric pattern 12*a* may include silicon oxide, and the second sub-isolation dielectric pattern 12*b* may include a dielectric material, such as silicon nitride, whose dielectric constant is greater than that of silicon oxide. Such structure mentioned above may increase a reflectance of light. In addition, when a negative bias is applied to the first and second silicon patterns 13 and 15, an electric field may be satisfactorily created on the first substrate 1, and thus holes may be favorably captured to sufficiently improve dark current characteristics.

The first substrate 1 may have therein photoelectric conversion elements PD in corresponding unit pixels PX. The photoelectric conversion elements PD may be doped with impurities having a second conductivity type opposite to the first conductivity type. The second conductivity type may be, for example, an n-type. The n-type impurities doped in the photoelectric conversion element PD and the p-type impurities doped in the first substrate 1 therearound may constitute a PN junction to provide a photodiode.

The first substrate 1 may have therein device isolation parts STI adjacent to the front surface 1*a*. The device isolation parts STI may have a single-layered or multi-layered structure of at least one selected from silicon oxide, silicon nitride, and silicon oxynitride. The pixel separation part DTI may penetrate the device isolation parts STI. On each, or one or more, pixel PX, the device isolation parts STI may define active sections ACT adjacent to the front surface 1*a*. The active sections ACT may be provided for the transistors TX, RX, DX, and SX of FIG. 2.

On each, or one or more, unit pixel PX, a transfer gate TG may be disposed on the front surface 1*a* of the first substrate 1. A portion of the transfer gate TG may extend into the first substrate 1. The transfer gate TG may have a vertical type. Alternatively, the transfer gate TG may be a planar type that does not extend into the first substrate 1. A gate dielectric layer Gox may be interposed between the transfer gate TG and the first substrate 1. A floating diffusion region PD may be disposed in the first substrate 1 on one side of the transfer gate TG. The floating diffusion region FD may be doped with impurities having, for example, the second conductivity type.

The image sensor 500 may be a backside illumination image sensor. The first substrate 1 may receive light incident through the rear surface 1*b* thereof. Electron-hole pairs may be created from the incident light at the PN junction. These created electrons may move toward the photoelectric conversion element PD. When a voltage is applied to the transfer gate TG, the electrons may move toward the floating diffusion region PD.

The first surface 1*a* may be covered with a first interlayer dielectric layer IL. The first interlayer dielectric layer IL may be formed of a multiple layer including at least one selected from a silicon oxide layer, a silicon nitride layer, a silicon oxynitride layer, and/or a porous low-k dielectric layer. The first interlayer dielectric layer IL may have first connection lines 17 disposed therein. The floating diffusion region FD may be connected to the first connection lines 17.

A fixed charge layer 24 may be disposed on the rear surface 1*b* of the first substrate 1. The fixed charge layer 24 may be in contact with the rear surface 1*b* of the first substrate 1. The fixed charge layer 24 may be formed of a single or multiple metal oxide layer including oxygen whose amount is less than its stoichiometric ratio, or may be formed of a single or multiple metal fluoride layer including fluorine whose amount is less than its stoichiometric ratio. The fixed charge layer 24 may thus have a negative fixed charge. The fixed charge layer 24 may be formed of a single or multiple layer of one of metal oxide and metal fluoride that include at least one metal selected from hafnium (Hf), zirconium (Zr), aluminum (Al), tantalum (Ta), titanium (Ti), yttrium (Y), and/or lanthanides. For example, the fixed charge layer 24 may include one or more of a hafnium oxide layer and/or an aluminum oxide layer. The fixed charge layer 35 may suppress dark current and white spot.

A first protection layer 44 may be stacked on the fixed charge layer 24. The first protection layer 44 may include at least one selected from plasma-enhanced tetraethyl orthosilicate (PETEOS), SiOC, $SiO_2$, and/or SiN. The first protection layer 44 may serve as one or more of an antireflection layer and/or a planarization layer.

The first protection layer 44 may be provided thereon with light-shield patterns 48*a*. The light-shield patterns 48*a* may be correspondingly provided thereon with low-refractive patterns 50*a*. The light-shield pattern 48*a* and the low-refractive pattern 50*a* may overlap the pixel separation part DTI and may have a grid shape when viewed in plan. The light-shield pattern 48*a* may include, for example, titanium. The low-refractive patterns 50*a* may have the same thickness and may include the same organic material. The low-refractive pattern 50*a* may have a refractive index less than those of color filters CF1 and CF2. For example, the low-refractive pattern 50*a* may have a refractive index equal to or less than about 1.3. The light-shield pattern 48*a* and/or the low-refractive pattern 50*a* may reduce, or prevent, crosstalk between neighboring unit pixels UP.

The color filters CF1 and/or CF2 may be disposed between the low-refractive patterns 50*a*. Each, or one or more, of the color filters CF1 and/or CF2 may have one of blue, green, and/or red colors. Alternatively, the color filters CF1 and/or CF2 may include different colors such as cyan, magenta, and/or yellow.

In the image sensor 500 according to some example embodiments, the color filters CF1 and/or CF2 may be arranged in Bayer pattern. Alternatively, the color filters CF1 and/or CF2 may be arranged in one of 2×2 Tetra, 3×3 Nona, and/or 4×4 Hexadeca patterns.

The color filters CF1 and/or CF2 may be provided thereon with microlenses ML. The microlenses ML may have their edges that are in contact with and connected to each other.

In the image sensor 500 according to some example embodiments, the first silicon pattern 13 may be present in the form of a liner shape in the pixel separation part DTI. In addition, the second silicon pattern 15 may connect the first silicon patterns 13 to each other while being in contact with portions of the first silicon patterns 13. Thus, a portion occupied by silicon may be relatively low in the pixel separation part DTI. There may be a reduction in silicon-induced light adsorption and loss, and thus optical sensitivity may be improved to provide the image sensor 500 with sharp images.

FIGS. 6A to 6J illustrate cross-sectional views showing a method of fabricating the image sensor of FIG. 4.

Figure 6A:
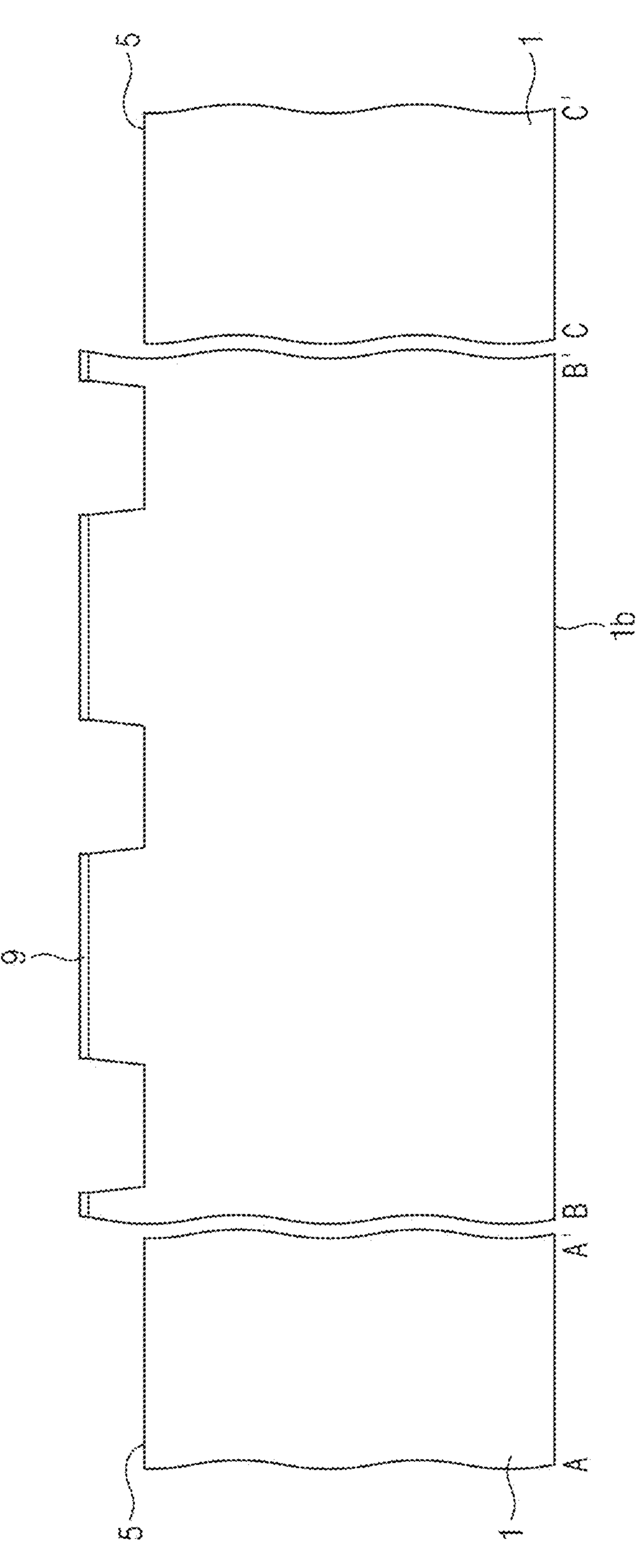
FIGS. 6A to 6J illustrate cross-sectional views showing a method of fabricating the image sensor of FIG. 4.

Referring to FIG. 6A, a first substrate 1 may be prepared. A first mask pattern 9 may be formed on a front surface 1*a* of the first substrate 1. The first mask pattern 9 may have a single-layered or multi-layered structure formed of at least one selected from, for example, silicon oxide, silicon nitride, and/or silicon oxynitride. The first mask pattern 9 may limit positions of active sections (see ACT of FIG. 3A) on the first surface 1*a*. The first mask pattern 9 may be used as an etching mask to etch the first surface 1*a* of the first substrate 1 to form a shallow trench 5.

Figure 6B:
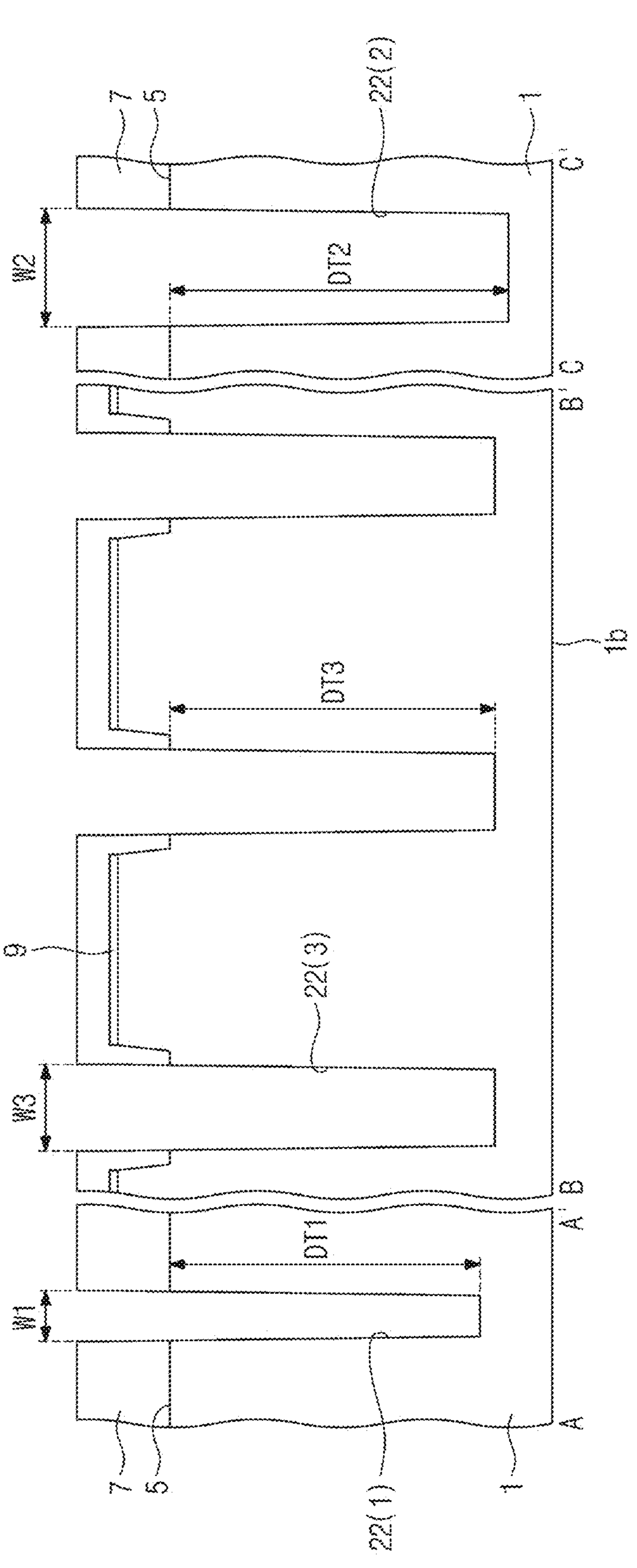

Referring to FIG. 6B, a second mask pattern 7 may be formed on the front surface 1*a* of the first substrate 1. The second mask pattern 7 may cover the first mask pattern 9 and fill a portion of the shallow trench 5. The second mask pattern 7 may limit a position of a pixel separation part (see DTI of FIG. 3A). The second mask pattern 7 may partially expose a bottom surface of the shallow trench 5. The second mask pattern 7 may have a single-layered or multi-layered structure including at least one selected from silicon oxide, SiN, SiCN, and/or SiOCN. The second mask pattern 7 may be used as an etching mask to etch the first substrate 1 to form a deep trench 22. When the deep trench 22 is formed, interference between etchants may form the deep trench 22 to have a shape the same as or similar to that of the pixel separation part DTI depicted in FIG. 3A. For example, the deep trench 22 may be formed to include first to third deep trenches 22(1) to 22(3). The first deep trench 22(1) may be positioned between first and second pixels (see PX(1) and PX(2) of FIG. 3A), and may be adjacent to edges of the first and second pixels PX(1) and PX(2). The second deep trench 22(2) may be positioned between first and third pixels (see PX(1) and PX(3) of FIG. 3A). The third deep trench 22(3) may be interposed between centers of the first and second pixels PX(1) and PX(2). The first deep trench 22(1) may be formed to have a first width W1 in a first direction X and a first depth DT1 from the bottom surface of the shallow trench 5. The second deep trench 22(2) may be formed to have a second width W2 in a third direction (see Z of FIG. 3A) and a second depth DT2 from the bottom surface of the shallow trench 5. The third deep trench 22(3) may be formed to have a third width W3 in the first direction X and a third depth DT3 from the bottom surface of the shallow trench 5. The third width W3 may be greater than the first width W1 and less than the second width W2. The third depth DT3 may be greater than the first depth DT1 and less than the second depth DT2.

Figure 6C:
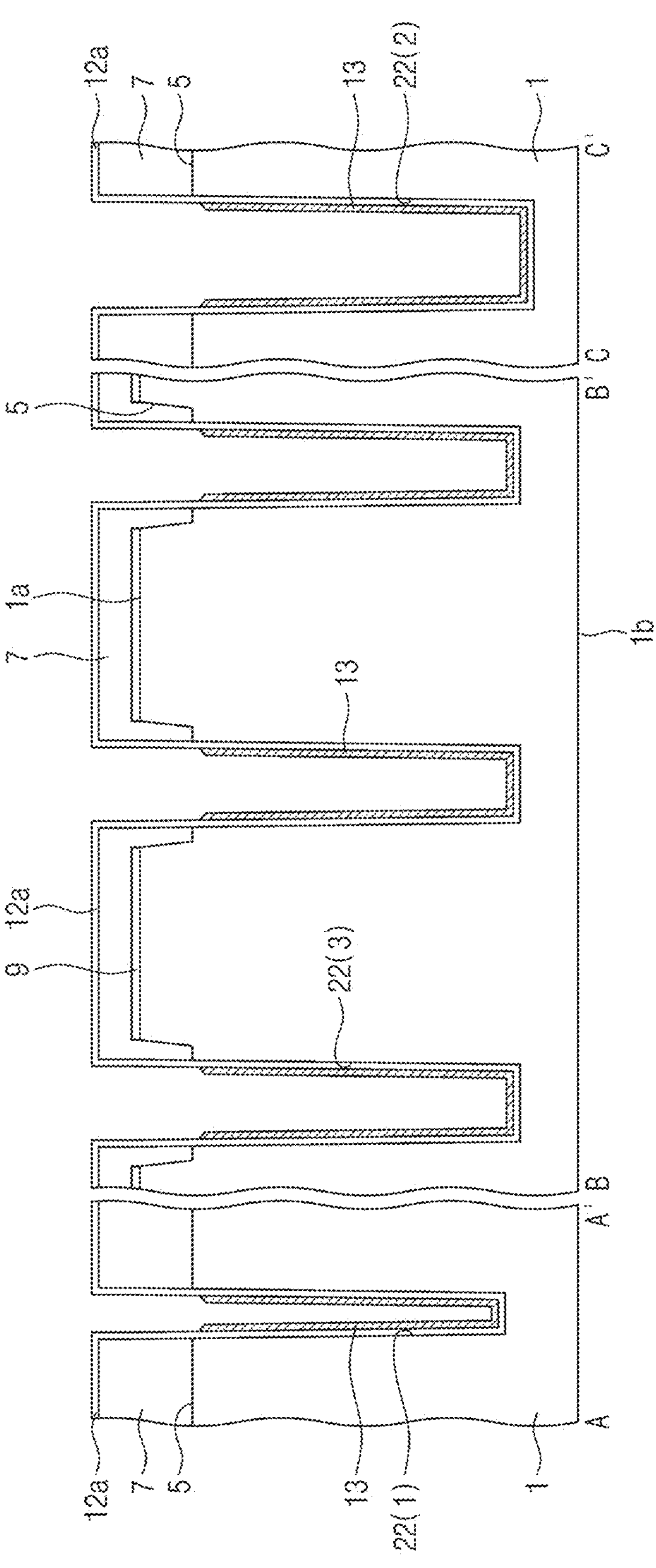

Referring to FIG. 6C, atomic layer deposition (ALD) may be used to conformally form a first isolation dielectric layer 12*a* on the front surface 1*a* of the first substrate 1 having the deep trench 22 formed therein. The first isolation dielectric layer 12*a* may have a thickness irrespective of position. The first isolation dielectric layer 12*a* may be formed to have a single-layered or multi-layered structure including at least one selected from silicon oxide, silicon nitride, silicon oxynitride, and/or silicon carbonitride. A first silicon layer may be conformally formed on the first isolation dielectric layer 12*a*, and then etched back to form a first silicon pattern 13 in the deep trench 22. When the first silicon layer is formed, first impurities (e.g., boron) may be in-situ doped. The first silicon pattern 13 may be formed to have a top end lower than the bottom surface of the shallow trench 5. The first silicon layer may be an amorphous polysilicon layer.

Figure 6D:
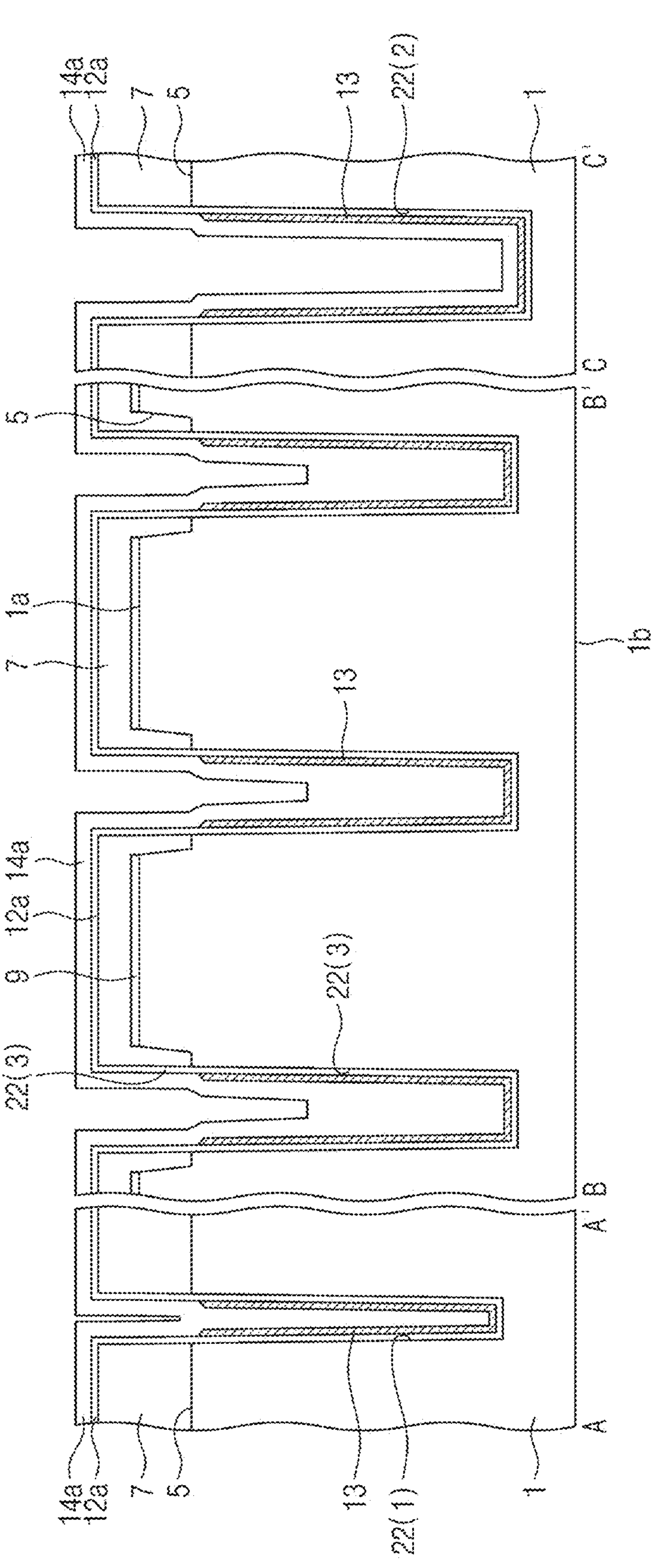

Referring to FIG. 6D, a first buried dielectric layer 14*a* may be stacked on the front surface 1*a* of the first substrate 1. The first buried dielectric layer 14*a* may be formed to have a thickness that fills most of the first deep trench 22(1), fills a portion of the second deep trench 22(2), and/or conformally covers an inner sidewall and a bottom surface of the third deep trench 22(3). The first buried dielectric layer 14*a* may be formed to have a single-layered or multi-layered structure including at least one selected from silicon oxide, silicon nitride, silicon oxynitride, and/or silicon carbonitride.

Figure 6E:
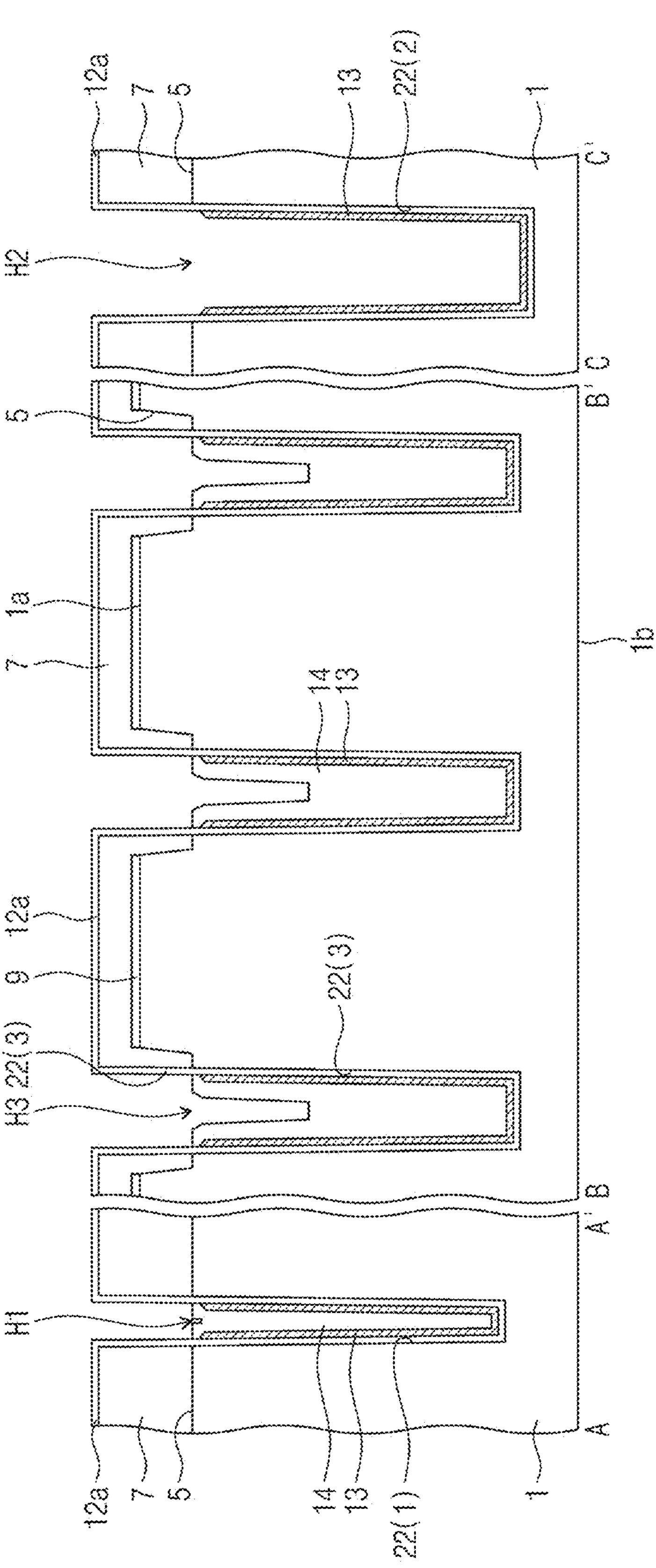

Referring to FIG. 6E, the first buried dielectric layer 14*a* may undergo an anisotropic etching process to form a first buried dielectric pattern 14 and to expose a top surface and an upper sidewall of the first isolation dielectric layer 12*a*. The first buried dielectric pattern 14 may be present in the first deep trench 22(1) and/or the third deep trench 22(3), but may be absent in the second deep trench 22(2). In the second deep trench 22(2), an inner surface of the first silicon pattern 13 may be exposed. In the first deep trench 22(1), a first hole H1 may be formed on an upper portion of the first buried dielectric pattern 14. In the third deep trench 22(3), a third hole H3 may be formed on an upper portion of the first buried dielectric pattern 14. In the second deep trench 22(2), the first silicon pattern 13 may form a second hole H2.

Figure 6F:
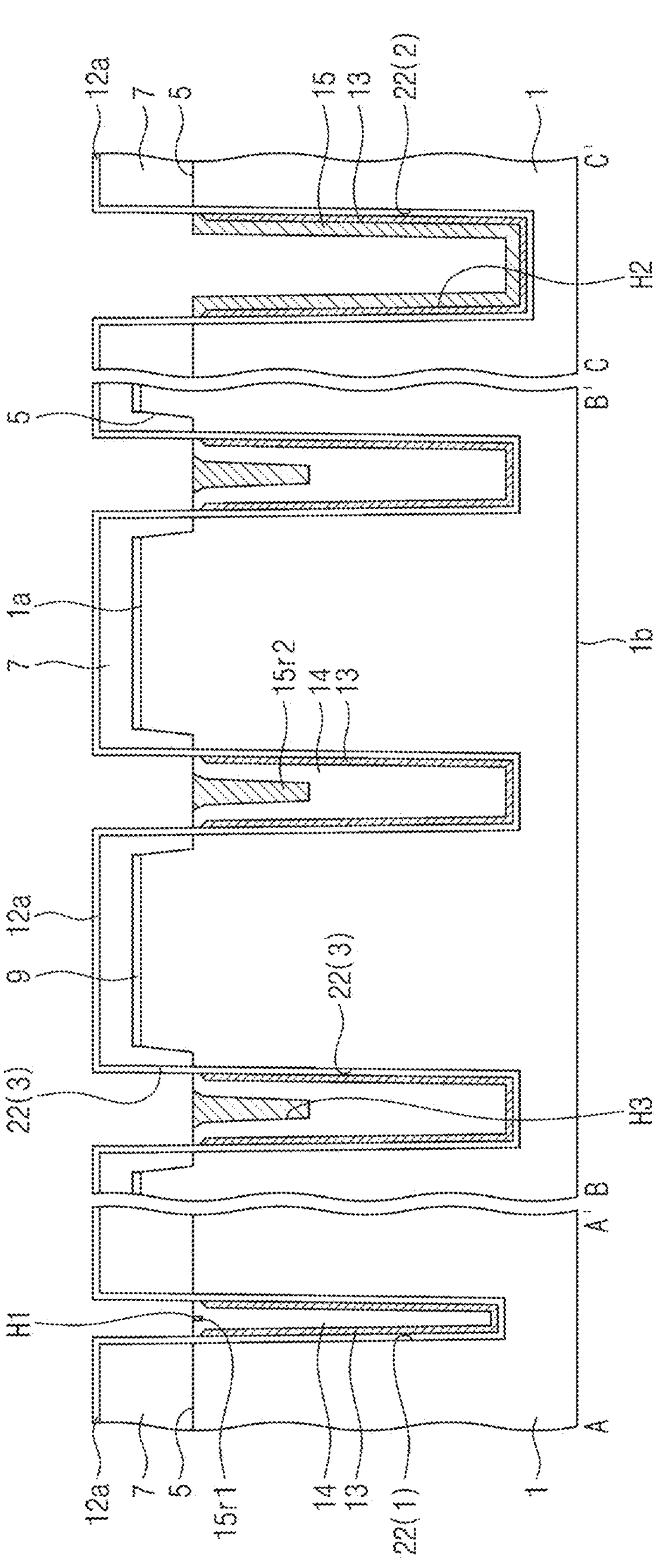

Referring to FIG. 6F, a second silicon layer may be deposited and etched back on the front surface 1*a* of the first substrate 1. The second silicon layer may be an amorphous polysilicon layer. Thus, the second hole H2 may have therein a second silicon pattern 15 that is formed to conformally cover the first silicon pattern 13. In this stage, a first residual silicon pattern 15*r*1 may be formed in the first hole H1, and a second residual silicon pattern 15*r*2 may be formed in the third hole H3. In the first hole H1 and the third hole H3, a top surface of the first buried dielectric pattern 14 may be exposed.

Figure 6G:
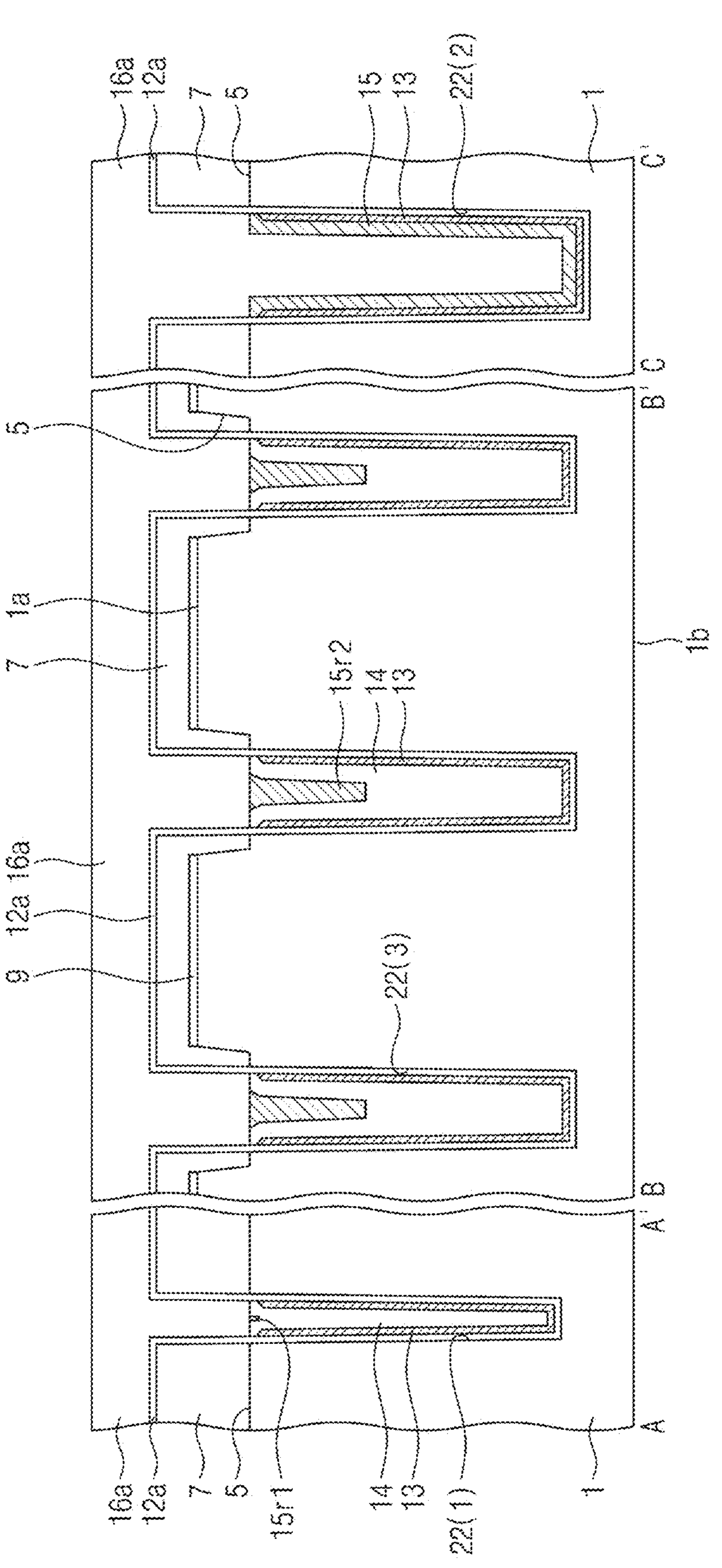

Referring to FIG. 6G, a second buried dielectric layer 16*a* may be formed on the front surface 1*a* of the first substrate 1, filling an upper portion of the deep trench 22. The second buried dielectric layer 16*a* may be formed to have a single-layered or multi-layered structure including at least one selected from silicon oxide, silicon nitride, silicon oxynitride, and/or silicon carbonitride.

An annealing process may be additionally performed to crystallize the first and/or second silicon patterns 13 and/or 15. In this stage, the first impurities (e.g., boron) doped in the first silicon pattern 13 may diffuse into the second silicon pattern 15.

Figure 6H:
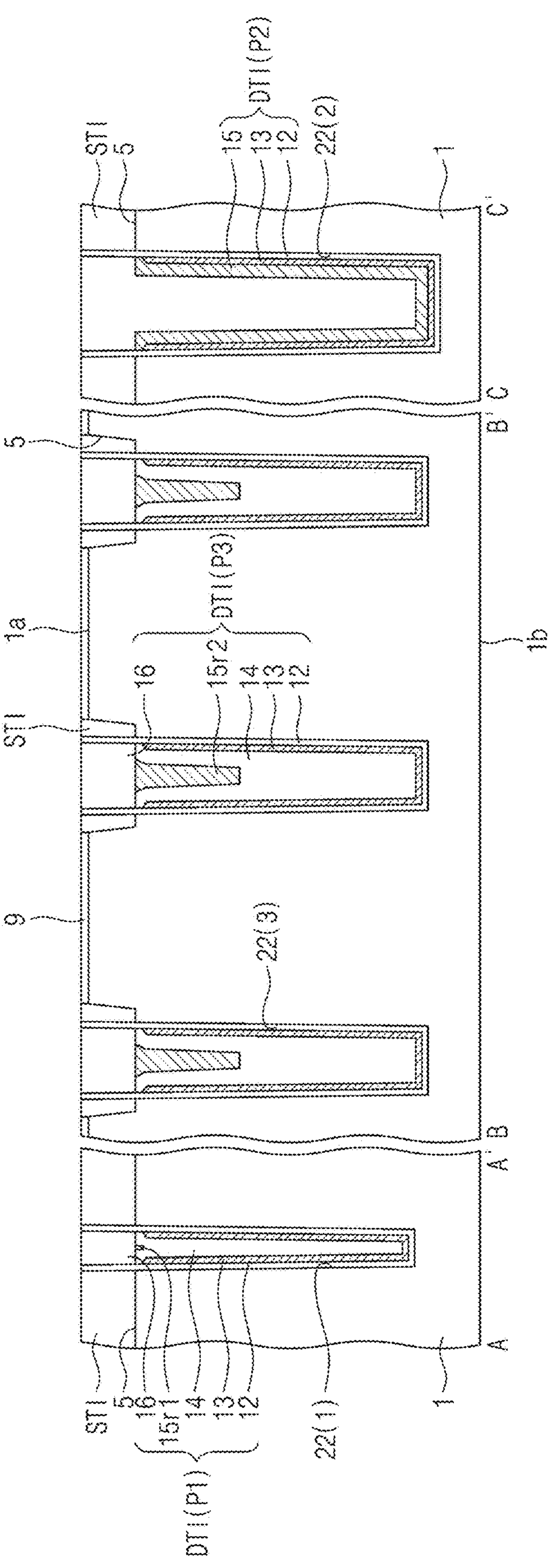

Referring to FIG. 6H, a chemical mechanical polishing (CMP) process may be performed to reduce, or remove, the second mask pattern 7, the first isolation dielectric layer 12*a*, and/or the second buried dielectric layer 16*a* that are formed on the first mask pattern 9 and to form a pixel separation part DTI in the deep trench 22. In the CMP process, the first mask pattern 9 may serve as a polishing stop layer. A portion of the second mask pattern 7 may remain to be a device isolation part STI.

Figure 6I:
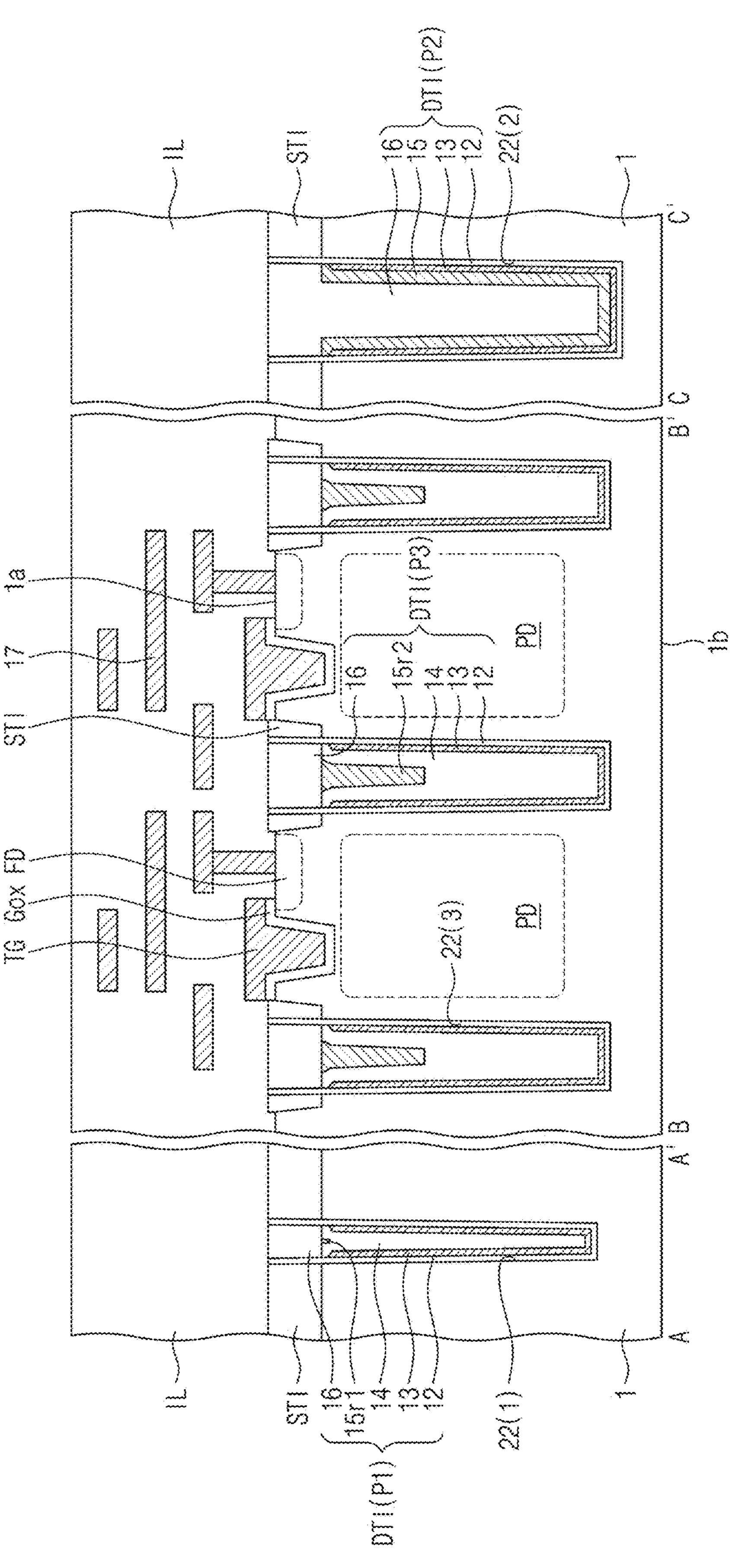

Referring to FIG. 6I, the first mask pattern 9 may be reduced, or removed, and the front surface 1*a* of the first substrate 1 may be exposed. Thus, the pixel separation part DTI and/or the device isolation part STI may have their top ends that upwardly protrude from the front surface 1*a* of the first substrate 1. The first substrate 1 may undergo an ion implantation process to form a photoelectric conversion element PD. A transfer gate TG, a gate dielectric layer Gox, and a floating diffusion region PD may be formed on the front surface 1*a* of the first substrate 1. A first interlayer dielectric layer IL and first connection lines 17 may be formed on the front surface 1*a* of the first substrate 1.

Figure 6J:
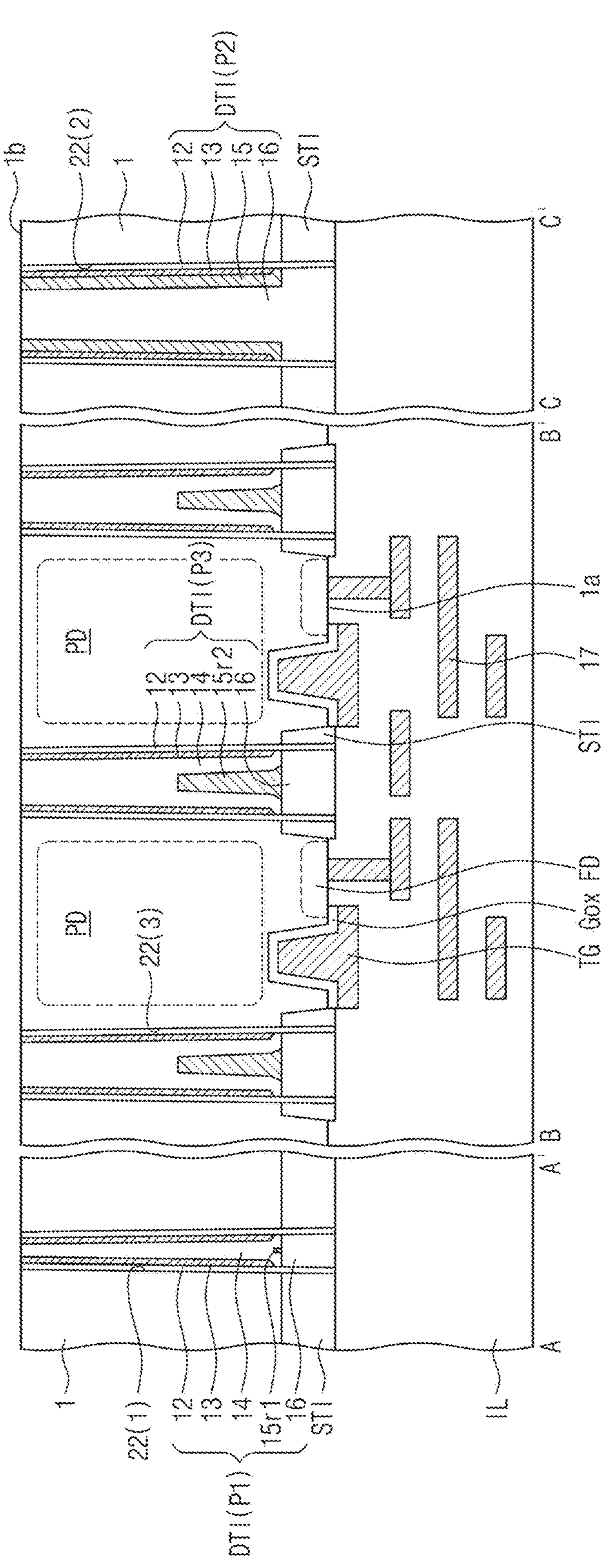

Referring to FIG. 6J, a rear surface 1*b* of the first substrate 1 may undergo a back grinding process to reduce, or remove, a portion of the first substrate 1 and a portion of the pixel separation part DTI. Therefore, there may be exposed the first and/or second buried dielectric patterns 14 and/or 16 and the first and/or second silicon patterns 13 and/or 15 of the pixel separation part DTI.

Referring to FIG. 4, typical processes may be performed to form a fixed charge layer 24, a first protection layer 44, a light-shield pattern 48*a*, a low-refractive pattern 50*a*, color filters CF1 and/or CF2, and/or microlenses ML on the rear surface 1*b* of the first substrate 1.

Figure 7:
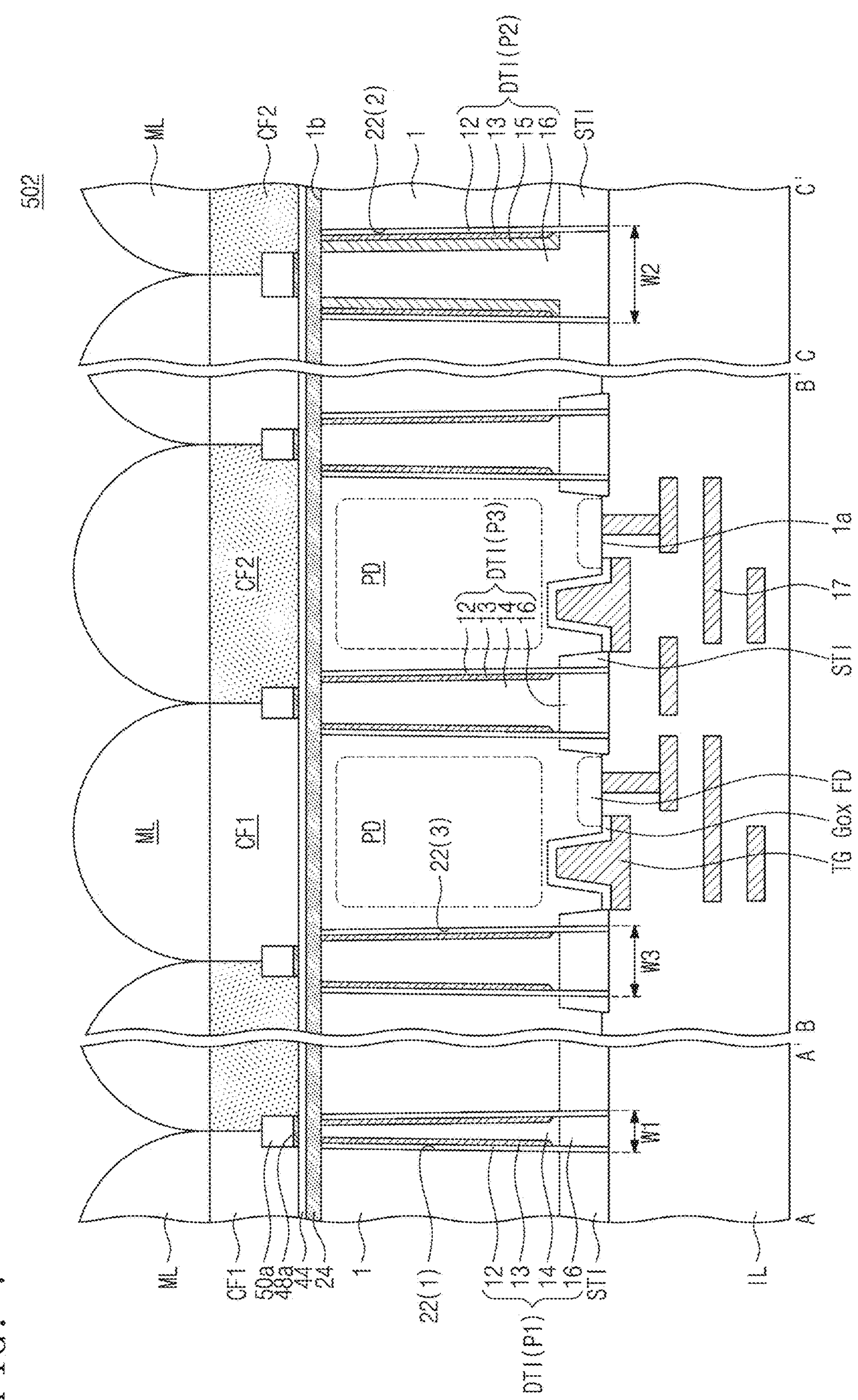
FIG. 7 illustrates a cross-sectional view showing an image sensor according to some example embodiments of the present inventive concepts.

FIG. 7 illustrates a cross-sectional view showing an image sensor according to some example embodiments of the present inventive concepts.

Referring to FIG. 7, an image sensor 502 according to some example embodiments may not include any of the first residual silicon pattern 15*r*1 and the second residual silicon pattern 15*r*2. In the first and/or third deep trenches 22(1) and/or 22(3), the first buried dielectric pattern 14 may have a flat bottom surface on which neither the first hole H1 nor the third hole H3 is formed. Other configurations may be identical or similar to those discussed above with reference to FIG. 4.

Figure 8:
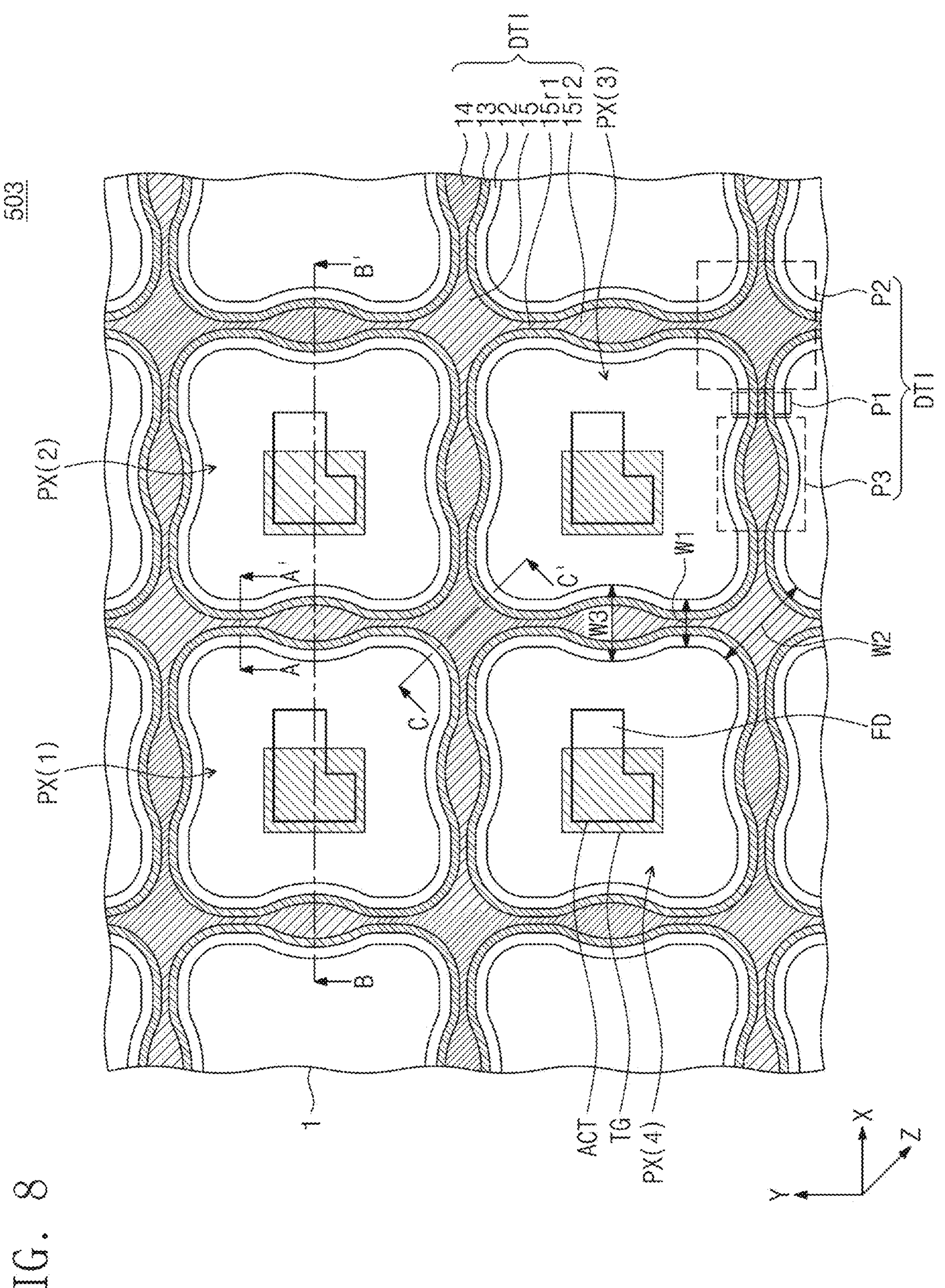
FIG. 8 illustrates a plan view showing an image sensor according to some example embodiments of the present inventive concepts.
Figure 9:
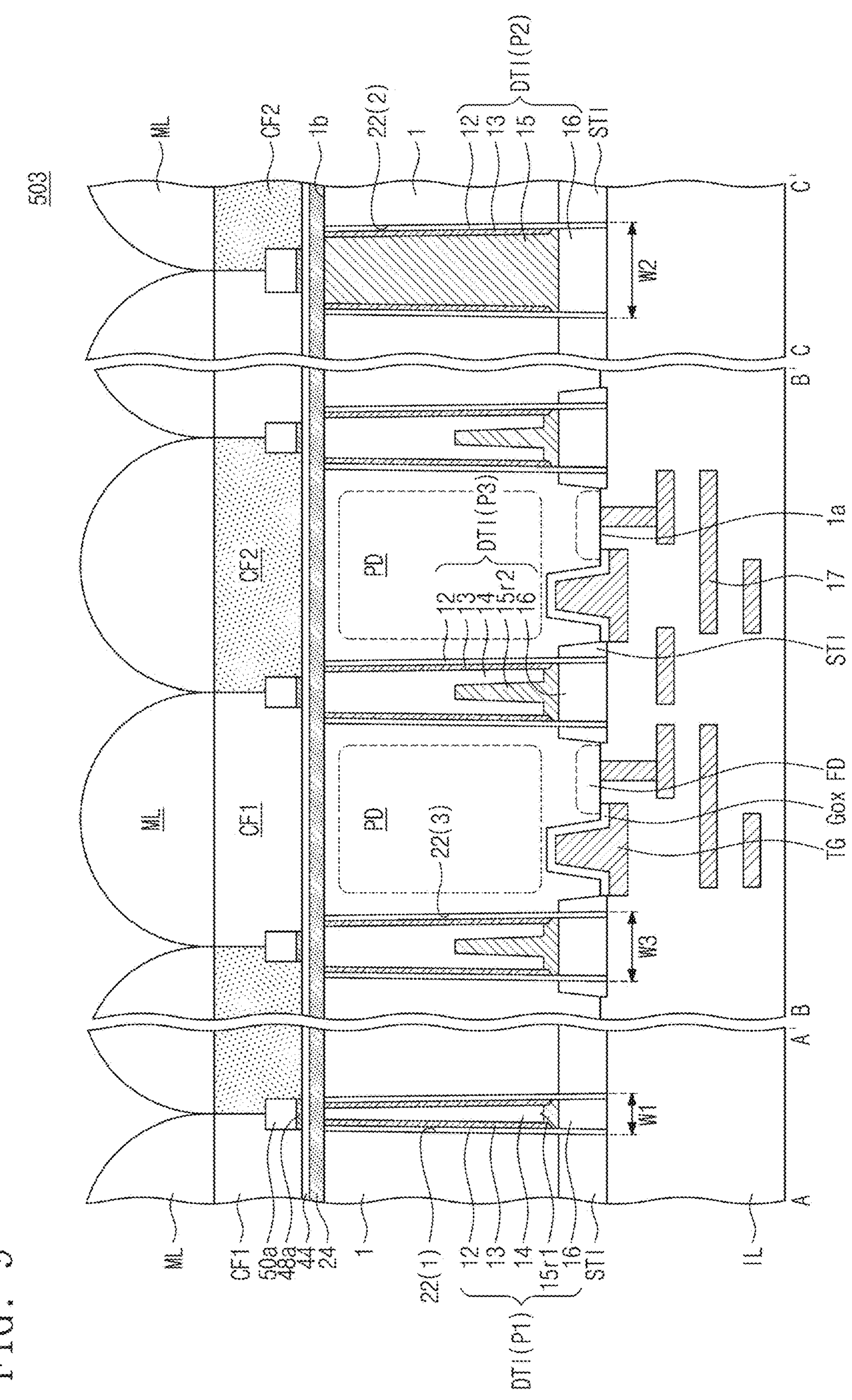
FIG. 9 illustrates a cross-sectional view taken along lines A-A', B-B', and C-C' of FIG. 8, showing an image sensor according to some example embodiments of the present inventive concepts.

FIG. 8 illustrates a plan view showing an image sensor according to some example embodiments of the present inventive concepts. FIG. 9 illustrates a cross-sectional view taken along lines A-A', B-B', and C-C' of FIG. 8, showing an image sensor according to some example embodiments of the present inventive concepts.

Referring to FIGS. 8 and 9, an image sensor 503 according to some example embodiments may be configured such that, in the first and/or third deep trenches 22(1) and/or 22(3), the first and/or second residual silicon patterns 15*r*1 and/or 15*r*2 may be in contact with a bottom end of the first silicon pattern 13 and interposed between the first silicon pattern 13 and the second buried dielectric pattern 16. The first and/or second residual silicon patterns 15*r*1 and/or 15*r*2 may be connected to the second silicon pattern 15. The second silicon pattern 15 may fill middle and upper portions of the second deep trench 22(2). Other configurations may be identical or similar to those discussed with reference to FIGS. 3A and 4.

Figure 10:
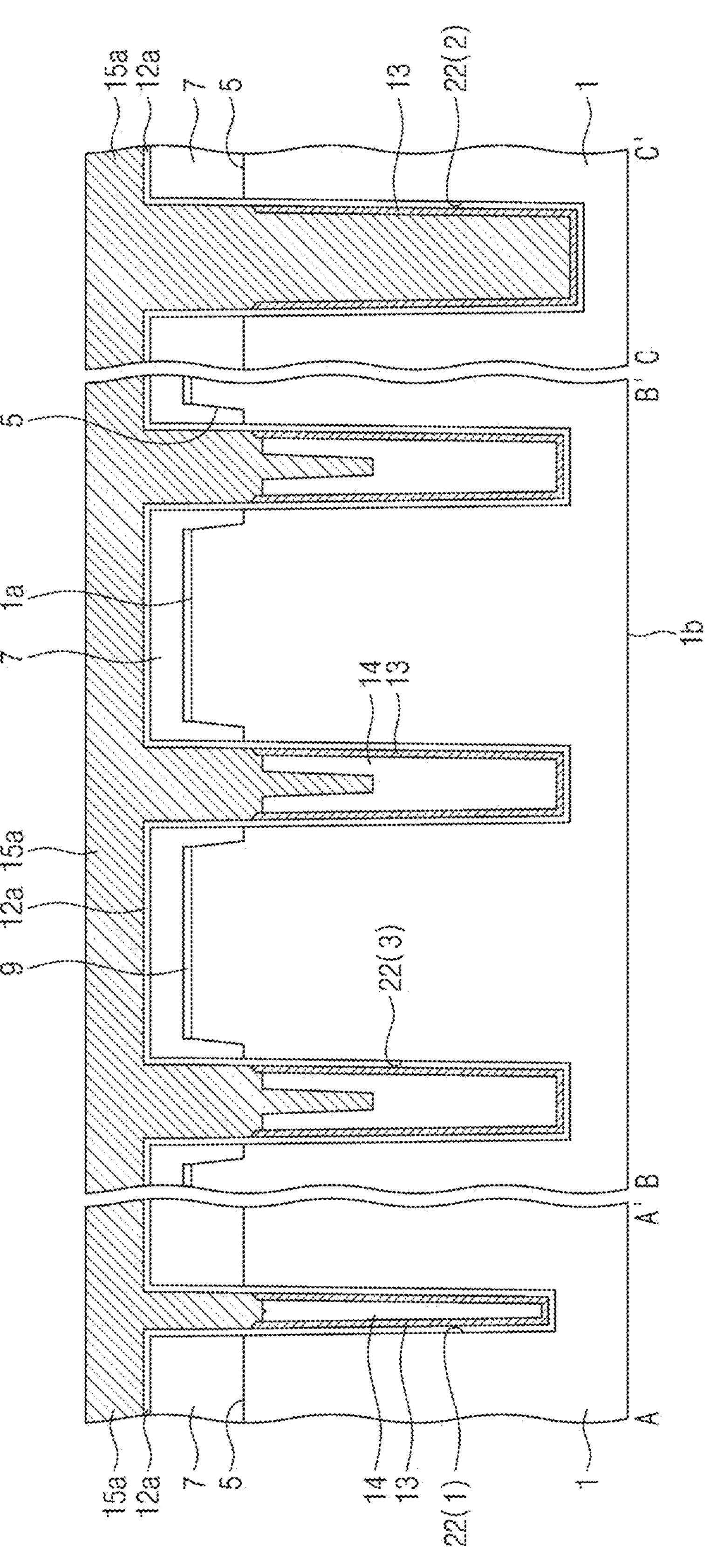
FIG. 10 illustrates a cross-sectional view showing a method of fabricating the image sensor depicted in FIG. 9.

FIG. 10 illustrates a cross-sectional view showing a method of fabricating the image sensor depicted in FIG. 9.

Referring to FIG. 10, in the step of FIGS. 6D and 6E, the first buried dielectric layer 14*a* may be etched a large amount to expose a top end of the first silicon pattern 13 and to form a first buried dielectric pattern 14 to have a top end lower than that of the first silicon pattern 13. A second silicon layer 15*a* may be deposited on the front surface 1*a* of the first substrate 1 to fill upper portions of the first and/or third deep trenches 22(1) and/or 22(3). The second silicon layer 15*a* may fill the second deep trench 22(2). The second silicon layer 15*a* may undergo an etch-back process to form a second silicon pattern 15. In this stage, in the first and third deep trenches 22(1) and 22(3), the second silicon pattern 15 may be formed to cover the first buried dielectric pattern 14. Subsequent processes may be identical or similar to those discussed above.

Figure 11:
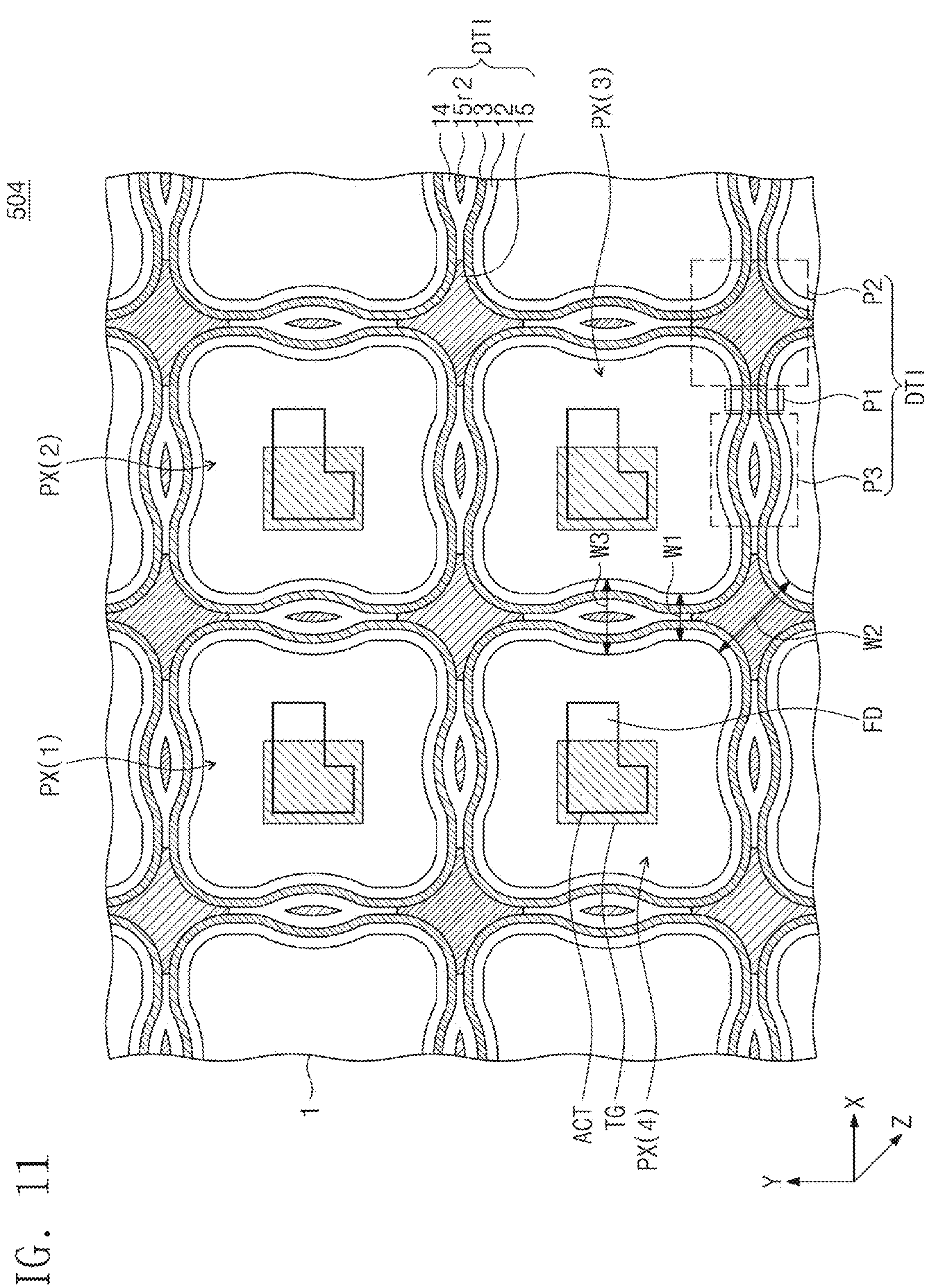
FIG. 11 illustrates a plan view showing an image sensor according to some example embodiments of the present inventive concepts.
Figure 12A:
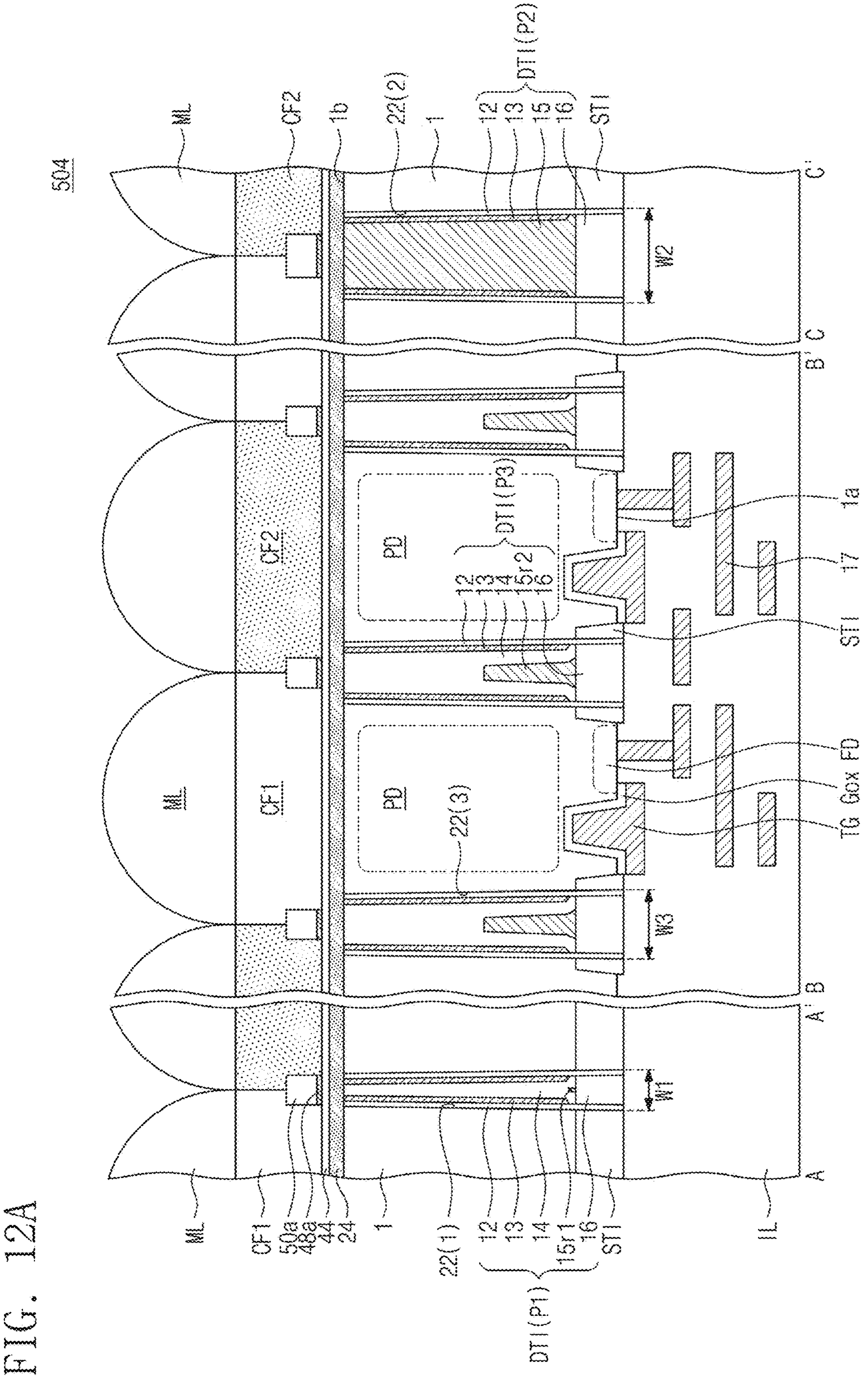
FIGS. 12A and 12B illustrate cross-sectional views taken along lines A-A', B-B', and C-C' of FIG. 11 according to some example embodiments of the present inventive concepts.
Figure 12B:
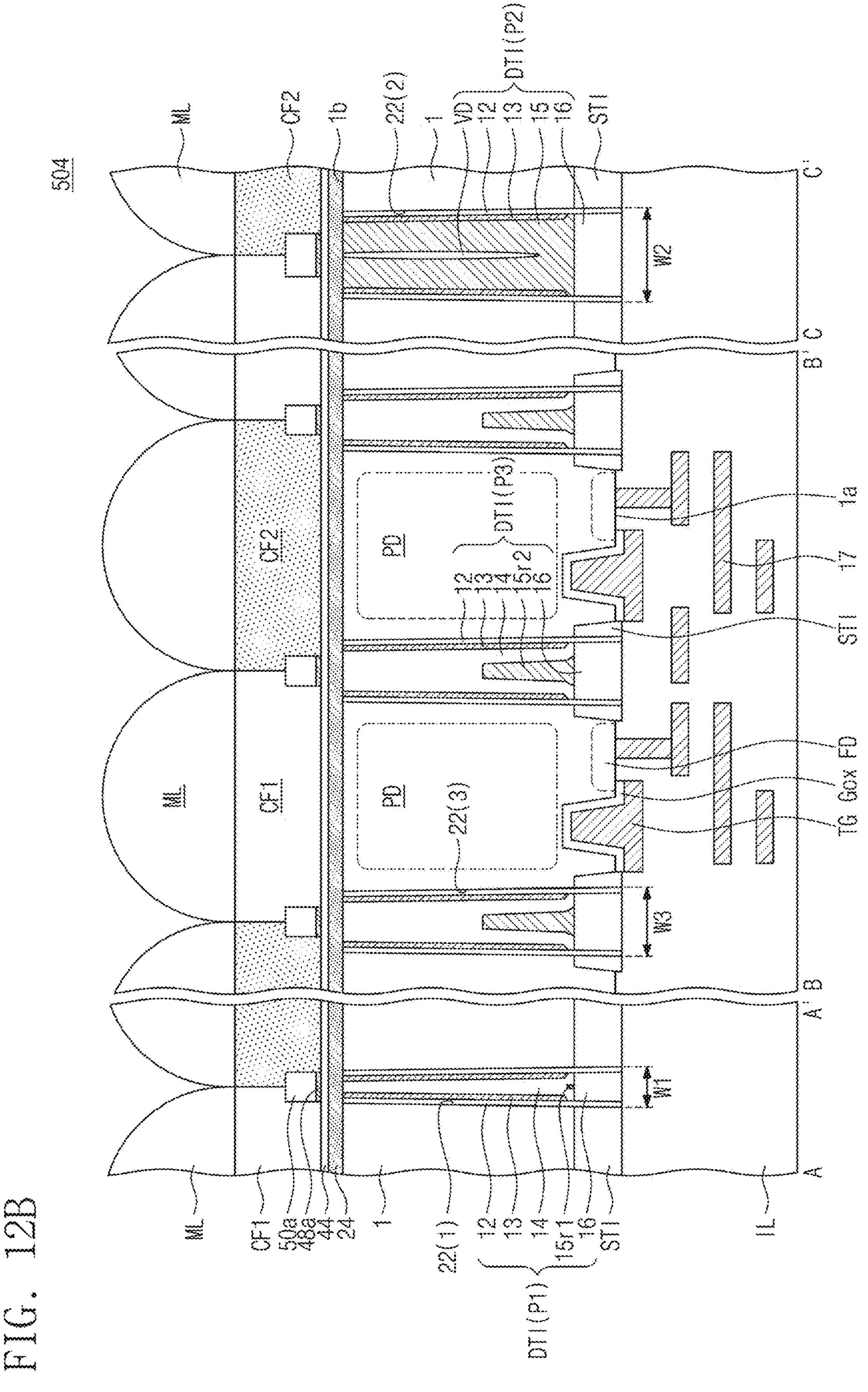

FIG. 11 illustrates a plan view showing an image sensor according to some example embodiments of the present inventive concepts. FIGS. 12A and 12B illustrate cross-sectional views taken along lines A-A', B-B', and C-C' of FIG. 11 according to some example embodiments of the present inventive concepts.

Referring to FIGS. 11, 12A, and 12B, an image sensor 504 according to some example embodiments may be configured such that the second silicon pattern 15 may fill middle and upper portions of the second deep trench 22(2) as shown in FIG. 12A. The second silicon pattern 15 may have a solid rhombic shape when viewed in plan. As shown in FIG. 12A, a void VD or seam may be absent in the second silicon pattern 15. Alternatively, as shown in FIG. 12B, a void VD or seam may be present in the second silicon pattern 15. A top end of the void VD may be closed by the fixed charge layer 24. In the first and/or third deep trenches 22(1) and 22(3), the first and/or second residual silicon patterns 15*r*1 and/or 15*r*2 may be disposed spaced apart from the first silicon pattern 13. Other configurations may be identical or similar to those discussed with reference to FIGS. 3A and 4.

Figure 13:
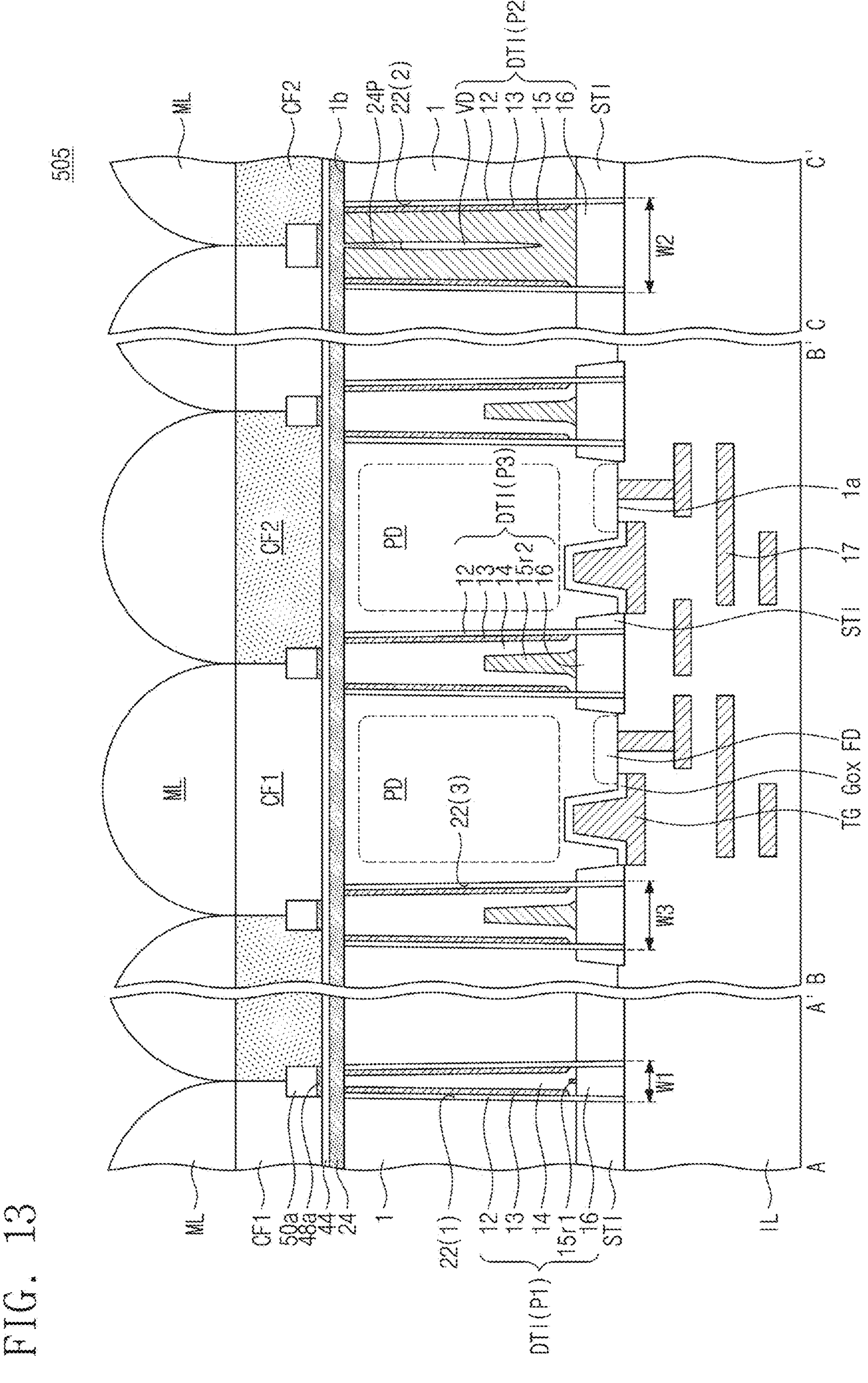
FIG. 13 illustrates a cross-sectional view taken along lines A-A', B-B', and C-C' of FIG. 11, showing an image sensor according to some example embodiments of the present inventive concepts.

FIG. 13 illustrates a cross-sectional view taken along lines A-A', B-B', and C-C' of FIG. 11, showing an image sensor according to some example embodiments of the present inventive concepts.

Referring to FIG. 13, an image sensor 505 according to some example embodiments may be configured such that, in the first and third deep trenches 22(1) and 22(3), the first and/or second residual silicon patterns 15*r*1 and/or 15*r*2 may be disposed spaced apart from the first silicon pattern 13. The second silicon pattern 15 may fill middle and upper portions of the second deep trench 22(2). A void VD or seam may be present in the second silicon pattern 15. A portion 24P of the fixed charge layer 24 may be inserted into the void VD. The portion 24P of the fixed charge layer 24 may fill the void VD. Although not shown, a portion of the first protection layer 44 may also be inserted into the void VD. Other configurations may be identical or similar to those discussed with reference to FIGS. 3A and 4.

Figure 14:
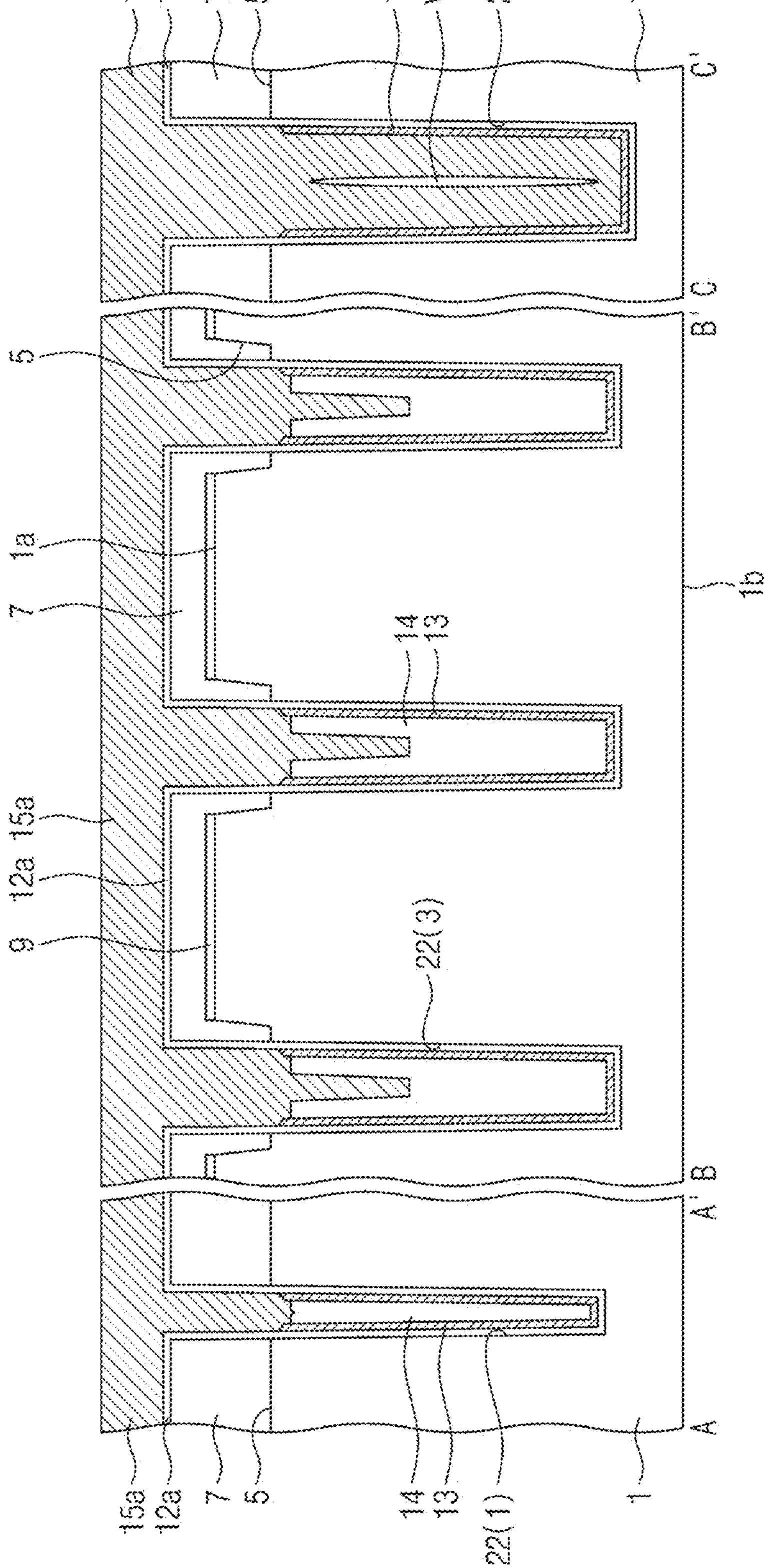
FIG. 14 illustrates a cross-sectional view showing a method of fabricating the image sensor depicted in FIG. 13.

FIG. 14 illustrates a cross-sectional view showing a method of fabricating the image sensor depicted in FIG. 13.

Referring to FIG. 14, in the second deep trench 22(2), a void VD or seam may be present in the second silicon layer 15*a* in the step of FIG. 10. Subsequently, the processes of FIGS. 6F to 6J may be performed. The void VD may be exposed when the back grinding process of FIG. 6J is performed. When a fixed charge layer 24 may be formed on the rear surface 1*b* of the first substrate 1, a portion 24P of the fixed charge layer 24 may be inserted into the void VD as shown in FIG. 13. Other processes may be identical or similar to those discussed above.

Figure 15:
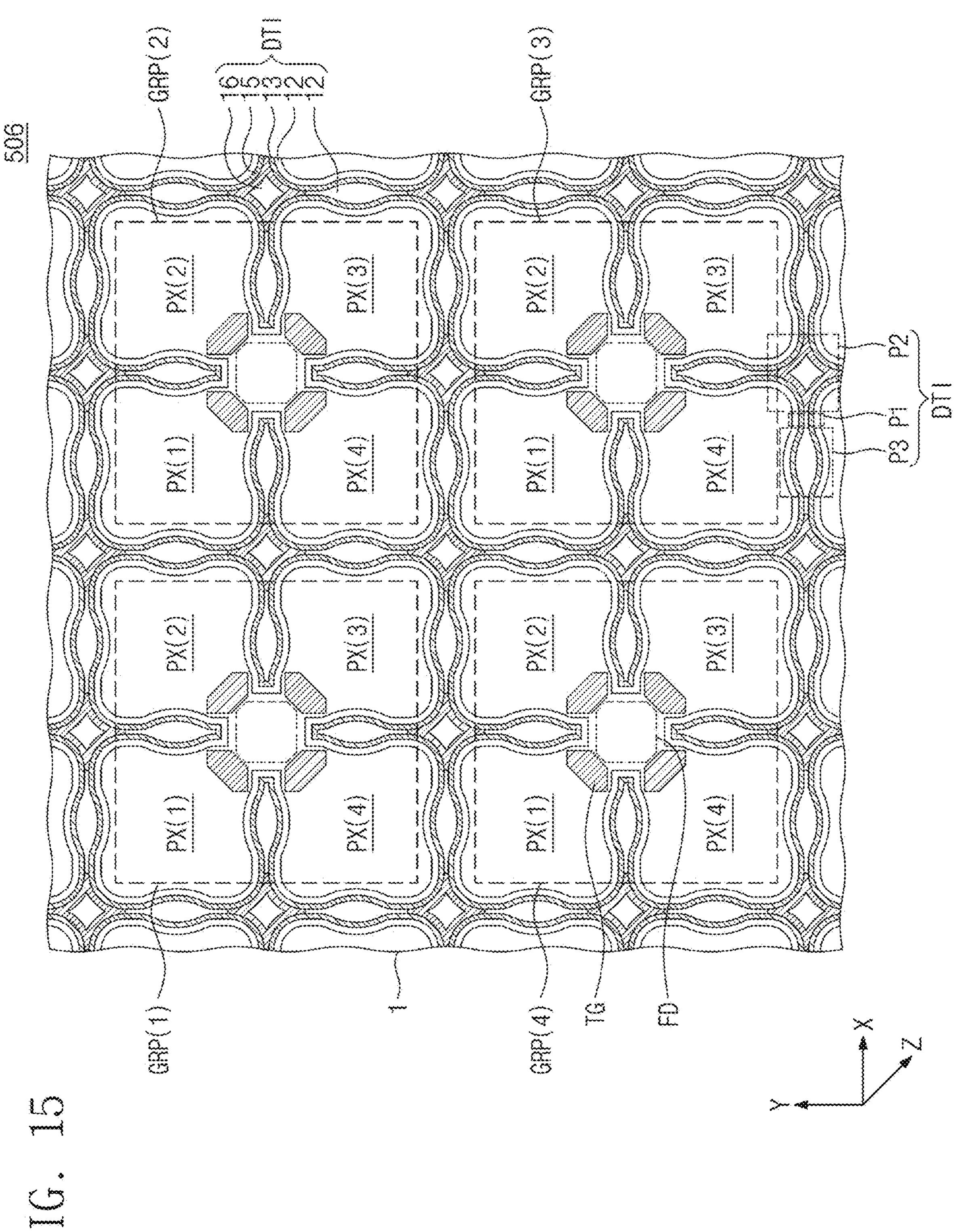
FIG. 15 illustrates a plan view showing an image sensor according to some example embodiments of the present inventive concepts.

FIG. 15 illustrates a plan view showing an image sensor according to some example embodiments of the present inventive concepts.

Referring to FIG. 15, an image sensor 506 according to some example embodiments may be configured such that the first to fourth pixels PX(1) to PX(4) may be disposed along a clockwise direction to constitute one pixel group GRP. The pixel separation part DTI may not be disposed on a center of the pixel group GRP. The floating diffusion region FD may be disposed on the center of the pixel group GRP. The transfer gates TG may be correspondingly disposed adjacent to the floating diffusion region FD in the first to fourth pixels PX(1) to PX(4). One floating diffusion region FD may be shared by the first to fourth pixels PX(1) to PX(4) that constitute one pixel group GRP. Although not shown, one pixel group GRP may be provided thereon with one color filter and one microlens.

The pixel group GRP may include first to fourth pixel groups GRP(1) to GRP(4) that are disposed along a clockwise direction. The pixel separation part DTI may have a second separation part P2 disposed between the first and third pixel groups GRP(1) and GRP(3). Other structural features may be identical or similar to those discussed above.

Figure 16:
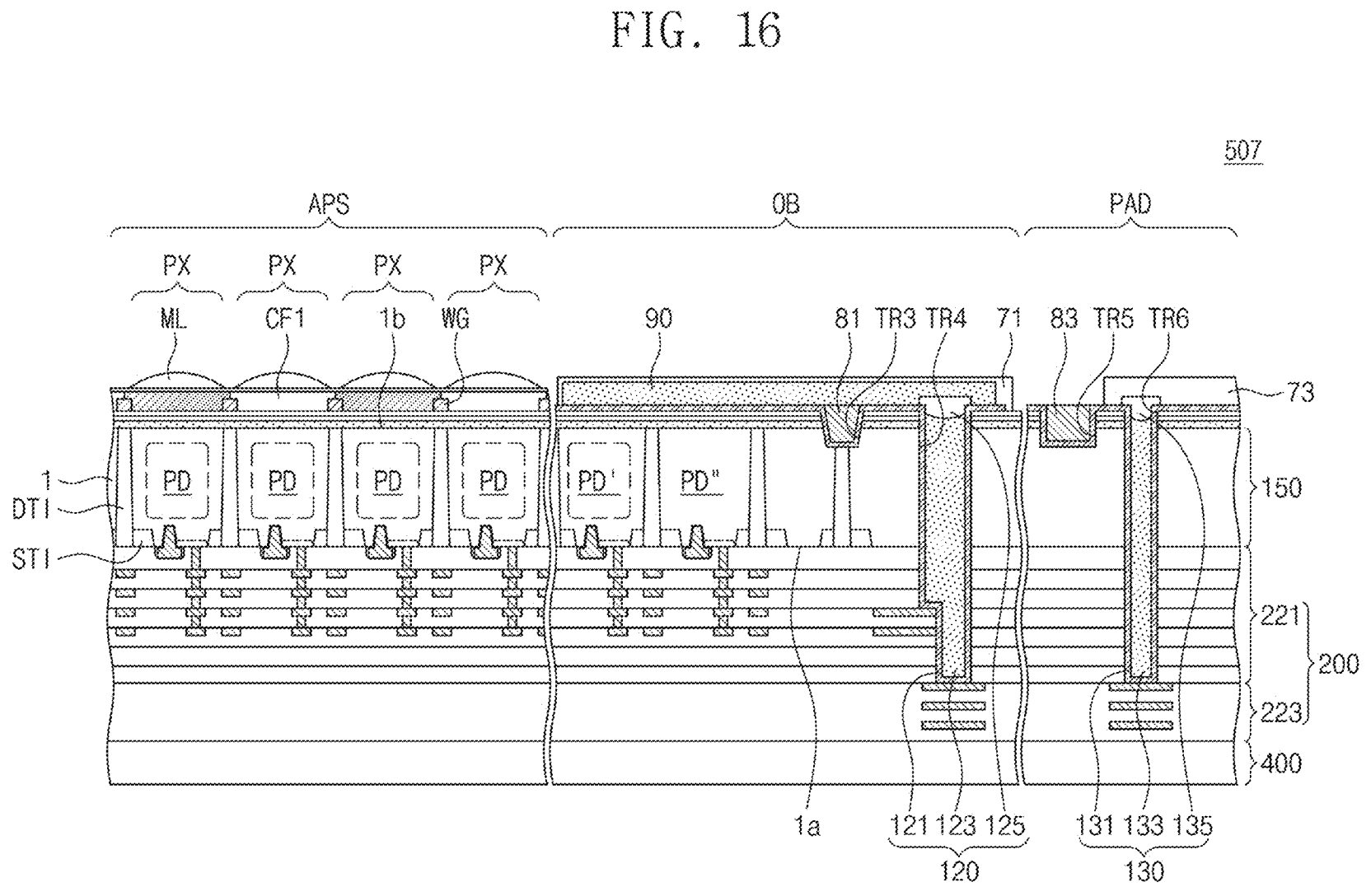

FIG. 16 illustrates a cross-sectional view showing an image sensor according to some example embodiments of the present inventive concepts.

Referring to FIG. 16, an image sensor 507 according to some example embodiments may include a first substrate 1 including a pixel array area APS, an optical black area OB, and a pad area PAD, and may also include a wiring layer 200 on a front surface 1*a* of the first substrate 1 and a second substrate 400 on the wiring layer 200. The wiring layer 200 may include an upper wiring layer 221 and a lower wiring layer 223. The pixel array area APS may include a plurality of unit pixels PX. The pixels PX disposed on the pixel array area APS may be substantially the same as that discussed above with reference to FIGS. 3A to 15.

On the optical black area OB, the first substrate 1 may be provided thereon with a light-shield pattern WG, a first connection structure 120, a first conductive pad 81, and/or a bulk color filter 90. The first connection structure 120 may include a first connection line 121, a dielectric pattern 123, and/or a first capping pattern 125.

A portion of the first connection line 121 may be provided on the rear surface 1*b* of the first substrate 1. The light-shield pattern WG may conformally cover inner walls of third and/or fourth trenches TR3 and/or TR4, while covering the rear surface 1*b*. The first connection line 121 may penetrate a photoelectric conversion layer 150 and/or the upper wiring layer 221 to connect the photoelectric conversion layer 150 to the wiring layer 200. For example, the first connection line 121 may be in contact with connection lines in the upper and lower wiring layers 221 and/or 223 and with first and/or second silicon patterns (see 13 and 15 of FIG. 4) of a pixel separation part DTI in the photoelectric conversion layer 150. Therefore, the first connection structure 120 may be electrically connected to connection lines in the wiring layer 200. The first connection line 121 may include a metallic material, such as tungsten. The light-shield pattern WG may block incidence of light into the optical black area OB.

The first conductive pad 81 may be provided in the third trench TR3 to fill an unoccupied portion of the third trench TR3. The first conductive pad 81 may include a metallic material, such as aluminum. The first conductive pad 81 may be connected to the first and/or second silicon patterns 13 and 15 of FIG. 4. A negative bias voltage may be applied through the first conductive pad 81 to the first and/or second silicon patterns 13 and 15 of FIG. 4. Therefore, it may be possible to prevent, or reduce, white spot and/or dark current.

The dielectric pattern 123 may fill an unoccupied portion of the fourth trench TR4. The dielectric pattern 123 may completely or partially penetrate the photoelectric conversion layer 150 and the wiring layer 200. The first capping pattern 125 may be provided on a top surface of the dielectric pattern 123. The first capping pattern 125 may be provided on the dielectric pattern 123.

The bulk color filter 90 may be provided on the first conductive pad 81, the light-shield pattern 121, and/or the first capping pattern 125. The bulk color filter 90 may cover the first conductive pad 81, the light-shield pattern 121, and/or the first capping pattern 125. A first protection layer 71 may be provided on and encapsulate the bulk color filter 90.

A photoelectric conversion element PD' and a dummy conversion element PD" may be provided on the optical black area OB of the first substrate 1. For example, the photoelectric conversion element PD' may be doped with impurities having the second conductivity type different from the first conductivity type. The second conductivity type may be, for example, an n-type. The photoelectric conversion element PD' may have a similar structure to that of a photoelectric conversion element PD on the pixel array area APS, but may not execute the same operation (e.g., generation of electrical signals from received light) as that of the photoelectric conversion element PD. The dummy conversion element PD" may not be doped with impurities. The dummy conversion element PD" may generate signals that are used as information to reduce, or remove, subsequent process noise.

On the pad area PAD, the first substrate 1 may be provided thereon with a second connection structure 130, a second conductive pad 83, and/or a second protection layer 73. The second connection structure 130 may include a second connection line 131, a dielectric pattern 133, and/or a second capping pattern 135.

The second connection line 131 may be provided on the rear surface 1*b* of the first substrate 1. For example, the second connection line 131 may conformally cover inner walls of fifth and/or sixth trenches TR5 and/or TR6, while covering the rear surface 1*b*. The second connection line 131 may penetrate the photoelectric conversion layer 150 and/or the upper wiring layer 221 to connect the photoelectric conversion layer 150 to the wiring layer 200. For example, the second connection line 131 may be in contact with connection lines in the lower wiring layer 223. Therefore, the second connection structure 130 may be electrically connected to connection lines in the wiring layer 200. The second connection line 131 may include a metallic material, such as tungsten.

The second conductive pad 83 may be provided in the fifth trench TR5 to fill an unoccupied portion of the fifth trench TR5. The second conductive pad 83 may include a metallic material, such as aluminum. The second conductive pad 83 may serve as an electrical connection path through which the image sensor 507 is connected to an external apparatus. The dielectric pattern 133 may fill an unoccupied portion of the sixth trench TR6. The dielectric pattern 133 may completely or partially penetrate the photoelectric conversion layer 150 and/or the wiring layer 200. The second capping pattern 135 may be provided on the dielectric pattern 133.

Figure 17:
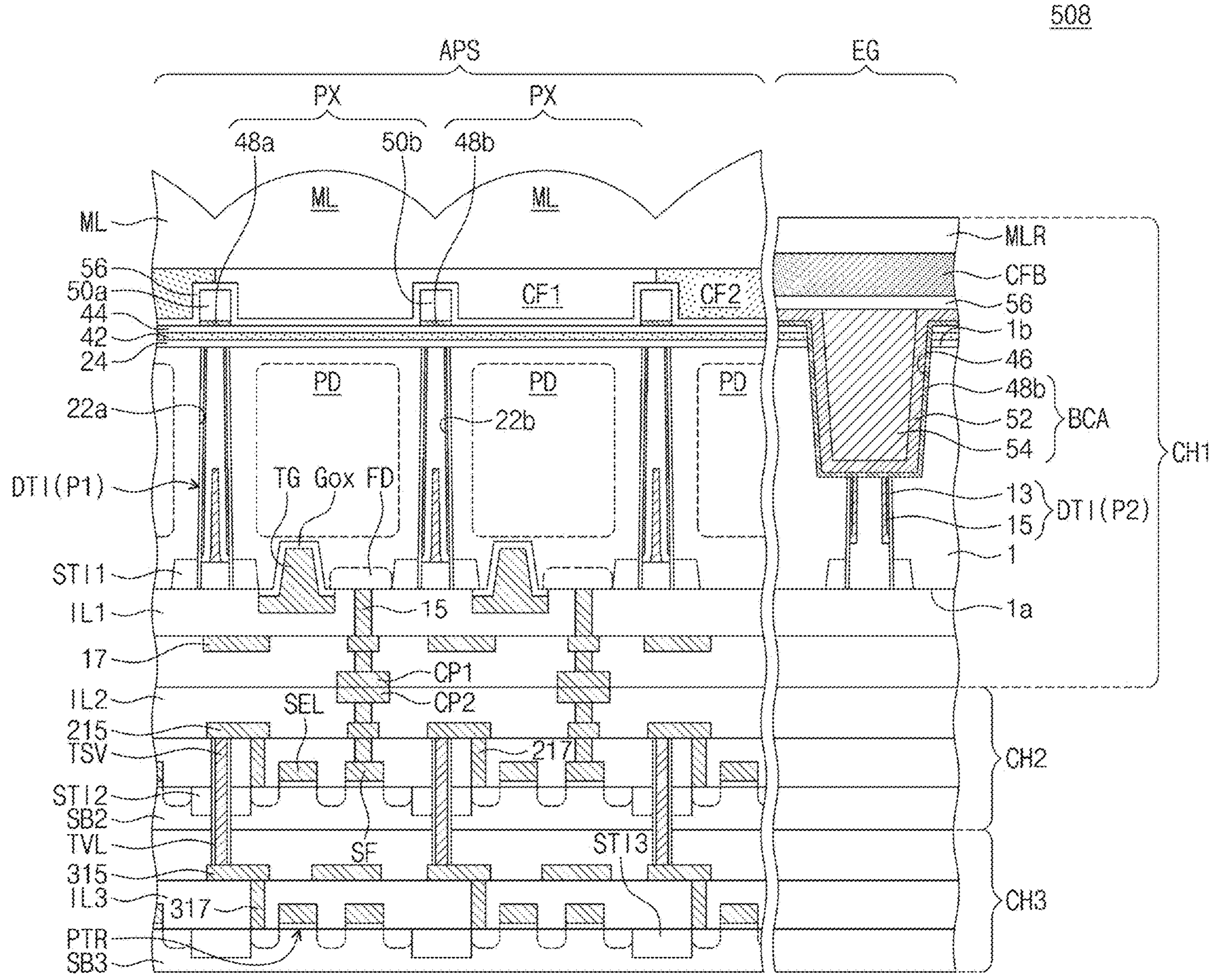
FIG. 17 illustrates a cross-sectional view showing an image sensor according to some example embodiments of the present inventive concepts.

FIG. 17 illustrates a cross-sectional view showing an image sensor according to some example embodiments of the present inventive concepts.

Referring to FIG. 17, an image sensor 508 according to some example embodiments may have a structure in which first to third sub-chips CH1 to CH3 are sequentially bonded. The first sub-chip CH1 may have, for example, an image sensing function. The first sub-chip CH1 may be identical or similar to that discussed with reference to FIGS. 3A to 15.

The first sub-chip CH1 may include transfer gates TG on the front surface 1*a* of the first substrate 1, and may also include first interlayer dielectric layers IL1 that cover the transfer gates TG. The first substrate 1 may include a pixel array area APS and an edge area EG. The pixel array area APS may include a plurality of unit pixels PX. The edge area EG may correspond to a portion of the optical black area OB of FIG. 16.

The first substrate 1 may be provided therein a first device isolation part STI1 that defines active sections. The first substrate 1 may be provided therein with a pixel separation part DTI that separates and/or limits the unit pixels PX on the pixel array area APS. The pixel separation part DTI may extend to the edge area EG. The pixel separation part DTI may be identical or similar to that discussed with reference to FIGS. 3A to 15.

The front surface 1*a* of the first substrate 1 may be covered with the first interlayer dielectric layers ILL The first interlayer dielectric layers IL1 may be provided with first connection lines 17 therebetween or therein. A floating diffusion region PD may be connected through a first contact plug 15 to the first connection lines 17. A first conductive pad CP1 may be disposed in a lowermost first interlayer dielectric layer ILL The first conductive pad CP1 may include copper.

On the edge area EG, a connection contact BCA may penetrate the first protection layer 44, the fixed charge layer 23, and a portion of the first substrate 1 to come into contact with the first and second silicon patterns 13 and 14. The connection contact BCA may be positioned in a third trench 46. The connection contact BCA may include a diffusion stop pattern 48*g* that conformally covers an inner sidewall and a bottom surface of the third trench 46, a first metal pattern 52 on the diffusion stop pattern 48*g*, and a second metal pattern 54 that fills the third trench 36. The diffusion stop pattern 48*g* may include, for example, titanium. The first metal pattern 52 may include, for example, tungsten. The second metal pattern 54 may include, for example, aluminum. The diffusion stop pattern 48*g* and the first metal pattern 52 may extend onto the first protection layer 44 to come into electrical connection with other connection lines, vias, and/or contacts.

A second protection layer 56 may be stacked on the first protection layer 44. The second protection layer 56 may conformally cover the light-shield pattern 48*a*, the low-refractive pattern 50*a*, and the connection contact BCA.

On the edge area EG, a first optical black pattern CFB may be disposed on the second protection layer 56. The first optical black pattern CFB may include, for example, the same material as that of a blue color filter.

On the edge area EG, a lens residual layer MLR may be disposed on the first optical black pattern CFB. The lens residual layer MLR may include the same material as that of the microlenses ML.

The second sub-chip CH2 may include a second substrate SB2, selection gates SEL, source follower gates SF, and/or reset gates (not shown) that are disposed on the second substrate SB2, and/or second interlayer dielectric layers IL2 that cover the selection gates SEL, the source follower gates SF, and/or the reset gates. The second substrate SB2 may be provided therein with a second device isolation part STI2 that defines active sections. The second interlayer dielectric layers IL2 may be provided therein with second contacts 217 and/or second connection lines 215. A second conductive pad CP2 may be disposed in an uppermost second interlayer dielectric layer IL2. The second conductive pad CP2 may include copper. The second conductive pad CP2 may be in contact with the first conductive pad CP1. The source follower gates SF may be connected to corresponding floating diffusion regions FD of the first sub-chip CH1.

The third sub-chip CH3 may include a third substrate SB3, peripheral transistors PTR disposed on the third substrate SB3, and/or third interlayer dielectric layers IL3 that cover the peripheral transistors PTR. The third substrate SB3 may be provided therein with a third device isolation part STI3 that defines active sections. The third interlayer dielectric layers IL3 may be provided therein with third contacts 317 and/or third connection lines 315. An uppermost third interlayer dielectric layer IL3 may be in contact with the second substrate SB2. A through electrode TSV may penetrate the second interlayer dielectric layer IL2, the second device isolation part STI2, the second substrate SB2, and/or the third interlayer dielectric layer IL3 to thereby connect the second connection line 215 to the third connection line 315. A sidewall of the through electrode TSV may be surrounded with a via dielectric layer TVL. The third sub-chip CH3 may include circuits either for driving one or both of the first sub-chip CH1 and/or the second sub-chip CH2 or for storing electrical signals generated from one or both of the first sub-chip CH1 and/or the second sub-chip CH2.

In an image sensor of the present inventive concepts, a first silicon pattern may be present in the form of a liner shape in a pixel separation part. In addition, a second silicon pattern may be in contact with portions of the first silicon patterns, and may connect the first silicon patterns to each other. Therefore, a portion occupied by silicon may be relatively low in the pixel separation part. Accordingly, there may be a reduction in silicon-induced light adsorption and loss, and thus optical sensitivity may be improved to provide an image sensor with sharp images.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. Some example embodiments of FIGS. 3A to 17 may be combined with each other.

What is claimed is:

1. An image sensor, comprising:

a substrate including a first surface and a second surface opposite to the first surface; and a pixel separation part in the substrate, the pixel separation part separating a plurality of pixels from each other, the plurality of pixels including a first pixel, a second pixel, a third pixel, and a fourth pixel in a clockwise direction, the pixel separation part including, a first part between the first pixel and the second pixel, and a second part between the first pixel and the third pixel, wherein each of the first part and the second part includes, a first dielectric pattern covering a lateral surface of the substrate, and a first silicon pattern covering a lateral surface of the first dielectric pattern, and the second part further includes a second silicon pattern adjacent to a sidewall of the first silicon pattern, the second silicon pattern having a rhombic shape in a plan view.

2. The image sensor of claim 1, wherein the first pixel is separated from the second pixel in a first direction, the first pixel and the third pixel are separated from each other in a second direction, the second direction intersecting the first direction, the first part has a first width in the first direction, the second part has a second width in the second direction, and the second width is greater than the first width.

3. The image sensor of claim 2, wherein the first width of the first part varies along the first direction.

4. The image sensor of claim 2, wherein the pixel separation part further includes a third part between a center of the first pixel and a center of the second pixel, the third part has a third width in the first direction, and the third width is greater than the first width and less than the second width.

5. The image sensor of claim 1, wherein the first part further includes a first buried dielectric pattern in contact with the sidewall of the first silicon pattern.

6. The image sensor of claim 5, wherein the first part further includes a first residual silicon pattern on an upper portion of the first buried dielectric pattern, and the first residual silicon pattern is spaced apart from the first silicon pattern.

7. The image sensor of claim 6, wherein the first residual silicon pattern has an oval shape in a plan view.

8. The image sensor of claim 5, wherein the first part further includes a first residual silicon pattern on an upper portion of the first buried dielectric pattern, the first residual silicon pattern is in contact with the first silicon pattern, and the first residual silicon pattern is electrically connected to the second silicon pattern.

9. The image sensor of claim 1, wherein the second part further includes a second buried dielectric pattern in contact with a sidewall of the second silicon pattern.

10. The image sensor of claim 1, wherein the first silicon pattern has a first average grain size, and the second silicon pattern has a second average grain size greater than the first average grain size.

11. The image sensor of claim 1, wherein the first silicon pattern has a first boron concentration, and the second silicon pattern has a second boron concentration less than the first boron concentration.

12. The image sensor of claim 1, further comprising a native oxide layer between the first silicon pattern and the second silicon pattern, wherein the native oxide layer has a thickness of 1 Å to 5 Å.

13. The image sensor of claim 1, further comprising a void within the second silicon pattern.

14. The image sensor of claim 13, further comprising:

a transfer gate on the first surface; and a fixed charge layer on the second surface, wherein a portion of the fixed charge layer defines a top end of the void or is inserted into the void.

15. The image sensor of claim 1, wherein the first silicon pattern has a first thickness, and the second silicon pattern has a second thickness greater than the first thickness.

16. An image sensor, comprising:

a substrate including a first surface, a second surface opposite to the first surface, and a deep trench; and a pixel separation part in the deep trench, the pixel separation part separating a plurality of pixels from each other, the plurality of pixels including a first pixel, a second pixel, a third pixel, and a fourth pixel in a clockwise direction, wherein the deep trench includes, a first deep trench between the first pixel and the second pixel, and a second deep trench between the first pixel and the third pixel, the pixel separation part includes, a first part in the first deep trench, and a second part in the second deep trench, each of the first part and the second part includes, a first dielectric pattern covering a lateral surface of the substrate, and a first silicon pattern covering a lateral surface of the first dielectric pattern, the first part further includes a first buried dielectric pattern in contact with a sidewall of the first silicon pattern, the sidewall of the first silicon pattern extending in a direction intersecting the lateral surface of the substrate, and the second part further includes a second silicon pattern in contact with the sidewall of the first silicon pattern, the second silicon pattern filling the second deep trench.

17. The image sensor of claim 16, wherein the first silicon pattern has a first average grain size, and the second silicon pattern has a second average grain size greater than the first average grain size.

18. The image sensor of claim 16, wherein the first silicon pattern has a first boron concentration, and the second silicon pattern has a second boron concentration less than the first boron concentration.

19. An image sensor, comprising:

a substrate including a first surface and a second surface opposite to the first surface; and a pixel separation part in the substrate, the pixel separation part separating a plurality of pixels from each other, the plurality of pixels including a first pixel, a second pixel, a third pixel, and a fourth pixel in a clockwise direction, the pixel separation part including, a first part between the first pixel and the second pixel, and a second part between the first pixel and the third pixel, wherein each of the first part and the second part includes, a first dielectric pattern covering a lateral surface of the substrate, and a first silicon pattern covering a lateral surface of the first dielectric pattern, and the second part further includes, a second silicon pattern in contact with a sidewall of the first silicon pattern, and a void within the second silicon pattern.

20. The image sensor of claim 19, wherein the first pixel is separated from the second pixel in a first direction, the first pixel and the third pixel are separated from each other in a second direction, the second direction intersecting the first direction, the first part has a first width in the first direction, the second part has a second width in the second direction, the pixel separation part further includes a third part between a center of the first pixel and a center of the second pixel, the third part has a third width in the first direction, and the third width is greater than the first width and less than the second width.

* * * * *